(12) United States Patent
Dasgupta et al.

(10) Patent No.: US 10,672,884 B2
(45) Date of Patent: Jun. 2, 2020

(54) SCHOTTKY DIODES ON SEMIPOLAR PLANES OF GROUP III-N MATERIAL STRUCTURES

(71) Applicant: INTEL CORPORATION, Santa Clara, CA (US)

(72) Inventors: Sansaptak Dasgupta, Hillsboro, OR (US); Marko Radosavljevic, Portland, OR (US); Han Wui Then, Portland, OR (US); Paul B. Fischer, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/322,816

(22) PCT Filed: Sep. 28, 2016

(86) PCT No.: PCT/US2016/054189
§ 371 (c)(1),
(2) Date: Feb. 1, 2019

(87) PCT Pub. No.: WO2018/063191
PCT Pub. Date: Apr. 5, 2018

(65) Prior Publication Data
US 2019/0189771 A1    Jun. 20, 2019

(51) Int. Cl.
*H01L 29/66* (2006.01)
*H01L 29/872* (2006.01)
(Continued)

(52) U.S. Cl.
CPC .. *H01L 29/66212* (2013.01); *H01L 21/76224* (2013.01); *H01L 21/8252* (2013.01);
(Continued)

(58) Field of Classification Search
None
See application file for complete search history.

(56) References Cited

U.S. PATENT DOCUMENTS 7,858,996 B2    12/2010  Zhong et al.
8,203,159 B2     6/2012  Zhong et al.
(Continued)

FOREIGN PATENT DOCUMENTS

WO    2018063191 A1    4/2018

OTHER PUBLICATIONS

International Search Report and Written Opinion received for PCT Application No. PCT/US2016/054189, dated May 31, 2017, 10 pages.
(Continued)

*Primary Examiner* — Telly D Green
(74) *Attorney, Agent, or Firm* — Finch & Maloney PLLC

(57) ABSTRACT

Techniques are disclosed for forming Schottky diodes on semipolar planes of group III-nitride (III-N) material structures. A lateral epitaxial overgrowth (LEO) scheme may be used to form the group III-N material structures upon which Schottky diodes can then be formed. The LEO scheme for forming III-N structures may include forming shallow trench isolation (STI) material on a semiconductor substrate, patterning openings in the STI, and growing the III-N material on the semiconductor substrate to form structures that extend through and above the STI openings, for example. A III-N structure may be formed using only a single STI opening, where such a III-N structure may have a triangular prism-like shape above the top plane of the STI layer. Further processing can include forming the gate (e.g., Schottky gate) and tied together source/drain regions on semipolar planes (or sidewalls) of the III-N structure to form a two terminal Schottky diode.

20 Claims, 9 Drawing Sheets

(51) Int. Cl.
   *H01L 29/20*    (2006.01)
   *H01L 27/02*    (2006.01)
   *H01L 27/06*    (2006.01)
   *H01L 21/8252*  (2006.01)
   *H01L 29/06*    (2006.01)
   *H01L 29/778*   (2006.01)
   *H01L 29/205*   (2006.01)
   *H01L 21/762*   (2006.01)
   *H01L 29/08*    (2006.01)
   *H01L 29/423*   (2006.01)

(52) U.S. Cl.
   CPC ...... *H01L 27/0255* (2013.01); *H01L 27/0605* (2013.01); *H01L 27/0629* (2013.01); *H01L 29/0653* (2013.01); *H01L 29/0657* (2013.01); *H01L 29/2003* (2013.01); *H01L 29/205* (2013.01); *H01L 29/7786* (2013.01); *H01L 29/872* (2013.01); *H01L 29/0843* (2013.01); *H01L 29/42316* (2013.01)

(56) References Cited

U.S. PATENT DOCUMENTS

| | | | |
|---|---|---|---|
| 9,666,677 B1* | 5/2017 | Raring | H01L 33/40 |
| 10,347,544 B2* | 7/2019 | Dasgupta | H01L 21/02505 |
| 2005/0118766 A1 | 6/2005 | Saggio et al. | |
| 2013/0252365 A1 | 9/2013 | Xu et al. | |
| 2013/0341705 A1 | 12/2013 | Raghavan et al. | |
| 2014/0231901 A1 | 8/2014 | Anderson et al. | |
| 2016/0133787 A1 | 5/2016 | Lochtefeld | |
| 2018/0323106 A1* | 11/2018 | Dasgupta | H01L 29/7786 |

OTHER PUBLICATIONS

International Preliminary Report on Patentability received for PCT Application No. PCT/US2016/054189, dated Apr. 2, 2019. 6 pages.

* cited by examiner

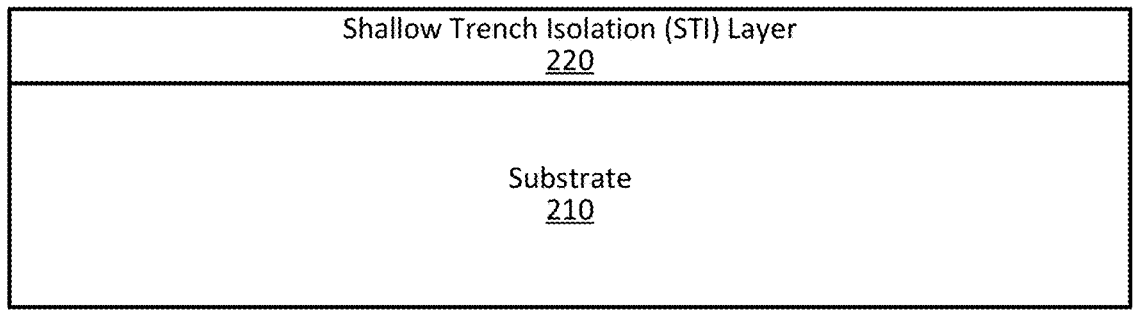
FIG. 2A
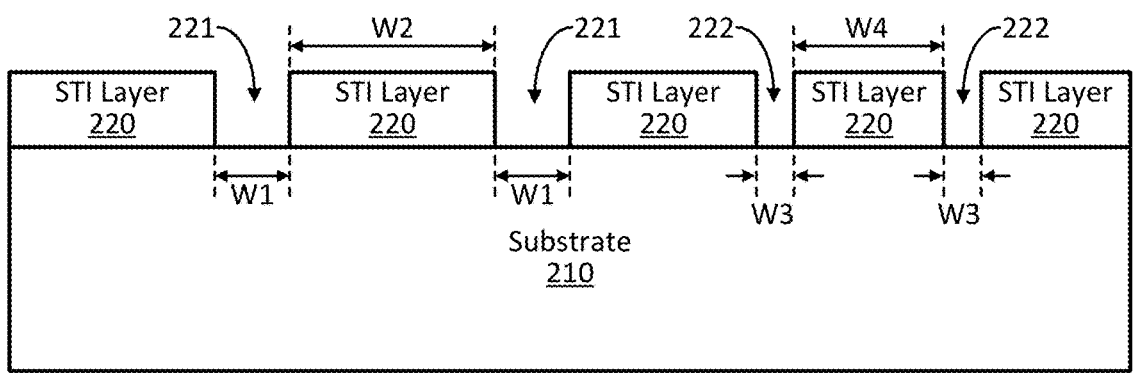
FIG. 2B
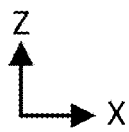

SCHOTTKY DIODES ON SEMIPOLAR PLANES OF GROUP III-N MATERIAL STRUCTURES

BACKGROUND

In the fields of wireless communication and power management, various components can be implemented using solid-state devices. For example, in radio frequency (RF) communication, the RF front-end is a generic term for the circuitry between an antenna and a digital baseband system. The RF front-end may include multiple components, such as power amplifiers, low-noise amplifiers, and voltage regulators. Such RF front-end components may include one or more semiconductor devices, such as diodes and transistors. Diodes are two-terminal devices, typically allowing the flow of current in only one direction. Semiconductor diodes come in multiple types, such as point-contact diodes, tunnel diodes, PIN diodes, and junction diodes. Junction diodes include p-n diodes and Schottky diodes. A p-n diode is formed by the junction of a p-type semiconductor (having a larger hole concentration than electron concentration) with an n-type semiconductor (having a larger electron concentration than hole concentration), thus the name p-n diode. A Schottky diode (also known as a hot carrier diode) is formed by the junction of a semiconductor with a metal or metal alloy.

There also exists multiple different semiconductor transistor devices, such as field-effect transistors (FETs). A FET is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include sidewall spacers (or so-called gate spacers) on either side of the gate that can help determine the channel length and can help with replacement gate processes, for example. Complementary MOS (CMOS) structures use a combination of p-channel MOSFET (PMOS) and n-channel MOSFET (NMOS) to implement logic gates and other digital circuits.

BRIEF DESCRIPTION OF THE DRAWINGS

FIG. 2A-D illustrate example IC structures formed when carrying out the method of FIG. 1, including forming multiple III-N structures on and forming a polarization layer on the III-N structures, in accordance with an embodiment of the present disclosure. Note that FIGS. 2A-D are cross-sectional views of the stack of the STI layer on the substrate, and features formed thereon.

FIGS. 2C' and 2C" are blown-out views of the top of the second III-N structure of FIG. 2C, illustrating alternative shapes for the top of that second III-N structure, in accordance with some embodiments.

FIG. 2D' is a blown-out view of a portion of a portion of the third III-N structure and polarization layer, illustrating a multilayer polarization layer, in accordance with an embodiment.

Figure 1:
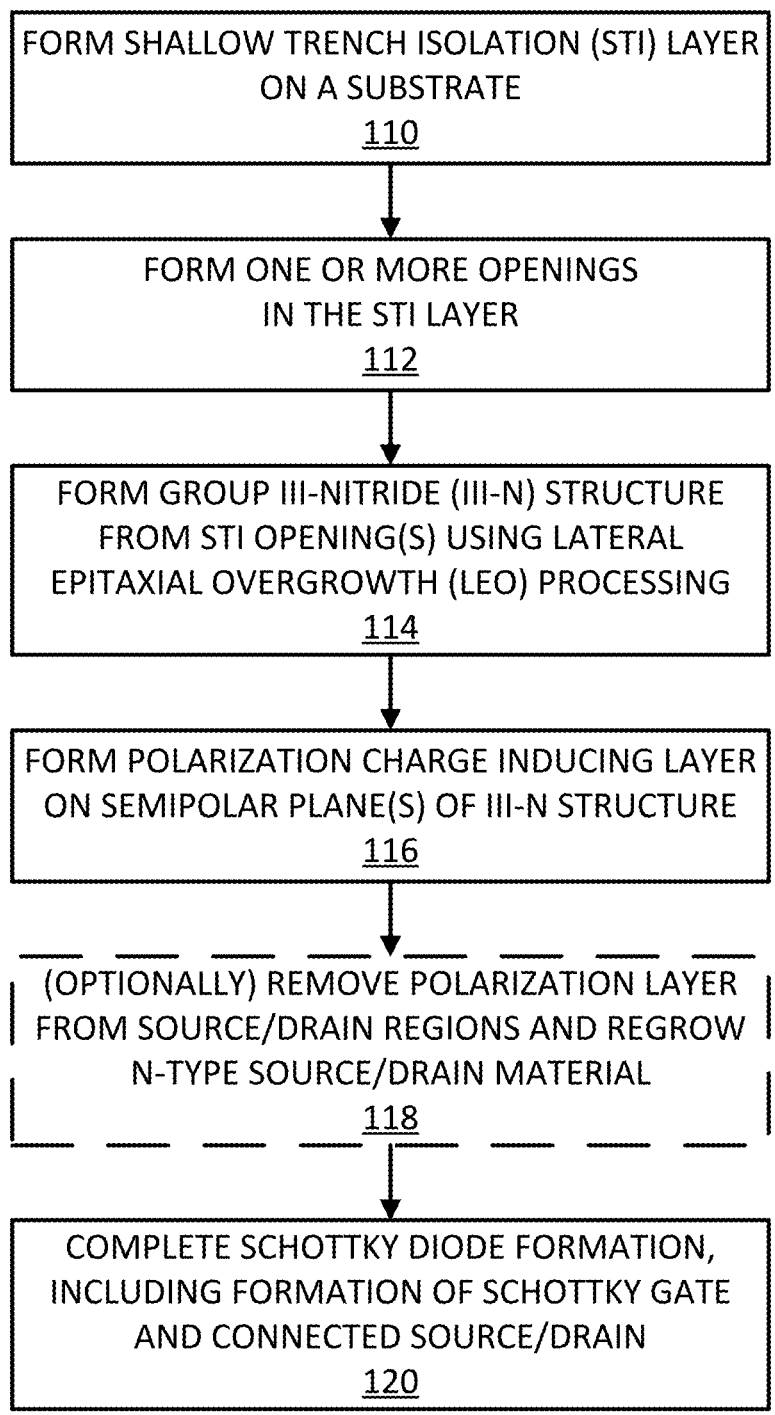
FIG. 1 illustrates a method of forming an integrated circuit (IC) including a Schottky diode formed on one or more semipolar planes of a group III-N structure, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

Techniques are disclosed for forming Schottky diodes on semipolar planes of group III-nitride (III-N) material structures. As will be apparent in light of this disclosure, a lateral epitaxial overgrowth (LEO) scheme can be used to form the group III-N material structures upon which Schottky diodes can then be formed, in some embodiments. In some such embodiments, the LEO scheme for forming III-N structures (e.g., GaN structures) may include forming shallow trench isolation (STI) material on a semiconductor substrate (e.g., a silicon (Si) substrate), patterning openings in the STI, and growing the III-N material on the semiconductor substrate to form structures that extend through and above the STI openings, for example. In some embodiments, the techniques may include forming a III-N structure using only a single STI opening, where such III-N structures have a triangular prism-like shape above the top plane of the STI layer. In other embodiments, the techniques may include forming a merged III-N structure using multiple adjacent STI openings, where the III-N material grown from the multiple adjacent STI openings merges together, and where such merged structures have a trapezoidal prism-like shape above the top plane of the STI layer. The processing can continue in a similar manner as the processing used to fabricate a III-N transistor; however, the source and drain (S/D) regions are tied together to form a two terminal Schottky diode (as opposed to a three terminal transistor), according to some embodiments. The techniques allow for the S/D regions and gate (e.g., a Schottky gate) to be formed on semipolar planes of the III-N structures. In other words and as will be apparent in light of this disclosure, Schottky diodes can be formed on the sidewalls of III-N structures formed using LEO processing as opposed to just forming the Schottky diodes as planar structures on the top of (or on the polar plane of) a III-N structure. Numerous variations and configurations will be apparent in light of this disclosure.

General Overview

In the context of RF applications, multiple different semiconductor devices are used to form the included circuitry. For instance, an electrostatic-discharge (ESD) protection circuit typically uses two diodes close to the core circuit. In the case of RF applications, the core circuit can include one or more power amplifier transistors or low noise amplifier transistors, for example. Thus, being able to form diodes in close proximity to transistors is desired for these RF circuits, especially for scaling purposes. Group III-nitride (III-N) semiconductor transistors have recently been explored for RF applications, due to the beneficial properties of the III-N material for such applications. One approach for forming diodes, and more specifically, Schottky diodes, for an RF circuit including III-N material transistors is to join together or otherwise electrically connect the source and drain of a planar III-N transistor (e.g., a gallium nitride (GaN) transistor). However, other techniques are desired for forming Schottky diodes, particularly in the context of RF application circuitry, such as for co-integration with non-planar III-N transistor devices, for example.

Thus and in accordance with one or more embodiments of this disclosure, techniques are provided for forming Schottky diodes on semipolar planes of group III-N material structures. As used herein, group III-N material or III-N material (or III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN). As will be apparent in light of this disclosure, a lateral epitaxial overgrowth (LEO) scheme can be used to form the group III-N material structures upon which Schottky diodes can then be formed, in some embodiments. In some such embodiments, the LEO scheme for forming III-N structures (e.g., GaN structures) may include forming shallow trench isolation (STI) material on a semiconductor substrate (e.g., a silicon (Si) substrate), patterning openings in the STI, and growing the III-N material on the semiconductor substrate to form structures that extend through and above the STI openings, for example. In some embodiments, the techniques may include forming a III-N structure using only a single STI opening, where such III-N structures have a triangular prism-like shape above the top plane of the STI layer. In other embodiments, the techniques may include forming a merged III-N structure using multiple adjacent STI openings, where the III-N material grown from the multiple adjacent STI openings merges together, and where such merged structures have a trapezoidal prism-like shape above the top plane of the STI layer. Whether III-N material will merge together when grown from adjacent STI openings using LEO processing can be controlled based on the processing conditions, such as the dimensions of the STI openings and/or the space between adjacent STI openings, as will be described in more detail herein.

Once a III-N structure is formed using LEO processing, a polarization charge inducing layer (e.g., an AlGaN layer) having a higher bandgap relative to the material of the III-N can be formed on semipolar planes of the III-N structure to create a two-dimensional electron gas (2DEG) configuration. Then, source and drain (S/D) regions and a gate (e.g., a Schottky gate) can be formed, where the S/D regions can be electrically connected together and used for one terminal of the two-terminal Schottky diode device, while the gate can be used for the other terminal. In some embodiments, the S/D regions may be formed using the polarization charge inducing layer. In other embodiments, the polarization charge inducing layer may be removed from those S/D regions and replaced with regrown n-type III-N material (e.g., n-type InGaN), such that the polarization charge inducing layer is only present below the gate and not present below the S/D regions. In any case, the techniques provided herein allow for the S/D regions and gate to be formed on semipolar planes of the III-N structures. In other words and as will be apparent in light of this disclosure, Schottky diodes can be formed on the sidewalls of III-N structures formed using LEO processing (where such III-N structures may be considered island structures) as opposed to forming the Schottky diodes as planar structures.

In some embodiments, the semipolar planes of III-N structures formed using LEO may be defined by the Miller-Bravais indices of those semipolar planes, where such Miller-Bravais indices include, but are not limited to, {11-22}, {10-11}, {10-13}, {10-1-3}, {1-101}, and {10-1-1}. Note that the use of (hkil) represents a family of lattice planes in the Miller-Bravais system represented by four integers h, k, i, and l, as is known in the art, and that the use of {hkil} denotes the set of all planes that are equivalent to (hkil) by the symmetry of the lattice. The Miller-Bravais indexing system can be used for hexagonal lattice systems, such as for GaN material structures. In some embodiments, the semipolar planes may be defined based on the angle of inclination relative to the polar c-plane (having a Miller-Bravais index of (0001)) and/or relative to the top plane of the STI layer, where the angle of inclination may be in the range of 10 to 80 degrees or 100 to 170 degrees relative to one or both of those planes, for example. For instance, using the specific semipolar planes having Miller-Bravais indices of {11-22} and {10-13}, the corresponding angles of inclination relative to the c-plane are 58.43 and 32.06 degrees, respectively, to provide a few examples. Such semipolar planes of III-N structures can be contrasted to nonpolar planes of III-N structures, which are generally in the range of 85 to 95 degrees relative to the polar c-plane and/or relative to the top plane of the STI layer. Two such families of nonpolar planes in III-N structures are the a-planes, which include the planes represented by the Miller-Bravais index of {11-20}, and the m-planes, which include the planes represented by the Miller-Bravais index of {10-10}. Planar surfaces (e.g., polar c-plane surfaces) are typically more suitable for III-N transistor fabrication, as a relatively thicker polarization charge inducing layer can be formed on such planar surfaces (e.g., compared to semipolar planes), thereby allowing for the formation of a 2DEG configuration with a relatively larger charge. However, semipolar planes can be suitable for Schottky diode fabrication. Therefore, III-N structures lacking a c-plane surface, such as those formed from single STI openings (and typically having a triangular prism-like shape), can be used for the formation of Schottky diodes, as will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit including a structure including group III-N material and formed using lateral epitaxial overgrowth (LEO) processing. Such LEO processing may be performed by forming a shallow trench isolation (STI) layer on a substrate, forming one or more openings in the STI layer, and growing the III-N material on the substrate and from the one or more openings. In some embodiments, only one STI opening may be used for the growth of the III-N structure, and in some such embodiments, the resulting structure may resemble a triangular prism-like structure above the top plane of the STI layer, as a result of the III-N material only (or primarily) growing from the substrate material and not from the STI material. In some embodiments, multiple adjacent STI openings may be used for the growth of the III-N structure, and in some such embodiments, the III-N material may merge together to form a resulting structure that may resemble a trapezoidal prism-like structure above the top plane of the STI layer. In any such embodiments, the structures include sidewalls (typically two) that are semipolar planes as variously defined herein. Using the sidewalls/semipolar planes of the III-N structures, a Schottky diode device can be formed as variously described herein.

In some embodiments, Schottky diodes as described herein may be detected within RF circuits. For instance, an electrostatic-discharge (ESD) protection circuit may be formed with two Schottky diodes as described herein, where the ESD protection circuit is located close to the core circuit for the particular RF application (e.g., wherein the core circuit includes one or more power amplifier transistors or low noise amplifier transistors). The Schottky diodes can be located close to the core circuit due to the diodes being formed using similar LEO processing as used for group III-N transistors included in the core circuit. Further, IC footprint/area benefits can be derived from use of the Schottky diodes described herein (e.g., as compared to use of conventional p-n diodes), because the Schottky diodes can be formed in close proximity to related core circuits as a part of the same RF circuit. Moreover, benefits may be derived due to the similar vertical dimensions involved between the III-N transistors included in an RF core circuit and included Schottky diodes as described herein (e.g., as compared to use of conventional p-n diodes). Further yet, processing benefits can be derived from use of the Schottky diodes described herein, because the diodes can be formed during the same processing used to form group III-N transistors formed on the same substrate/wafer/die, for example. Further still, the use of Schottky diodes as described herein provide enhanced properties in the context of RF application circuitry (e.g., as compared to conventional Si p-n diodes), because they are especially useful for high-frequency RF applications due to Schottky diodes having relatively low forward voltage requirements, thereby allowing higher switching speeds and better system efficiency. Numerous configurations and variations will be apparent in light of this disclosure.

Architecture and Methodology

FIG. 1 illustrates a method 100 of forming an integrated circuit (IC) including a Schottky diode formed on one or more semipolar planes of a group III-N structure, in accordance with some embodiments of the present disclosure. FIGS. 2A-D, 3A-B, and 4A-B illustrate example integrated circuit structures that are formed when carrying out the method 100 of FIG. 1, in accordance with some embodiments. As will be apparent in light of this disclosure, in some embodiments, the group III-N structures used for Schottky diode formation can be grown using lateral epitaxial overgrowth (LEO) processing. In some such embodiments, the LEO processing may include, for example, forming a shallow trench isolation (STI) layer on a substrate and patterning the STI layer to form openings that allow access to the substrate, followed by growing the III-N material on the substrate and from the openings formed in the STI layer. In some cases, a nucleation layer may be formed on the substrate prior to forming the III-N structure, such that the nucleation layer is between the III-N structure and the substrate in the end structure, as will be described in more detail herein. LEO processing may be used to address defects that would otherwise be present in the III-N structure, because the III-N material of the structure grows out from the STI openings and above the STI layer, causing any included defects to bend or otherwise form over the STI features, leaving the remainder of the III-N layer suitable for semiconductor device formation (e.g., to form diodes, transistors, and so forth). In such cases, defects may be present due to the lattice mismatch between the III-N material and the substrate material, from which the III-N material is grown. For instance, in some embodiments, the III-N structures may be formed on a Si substrate, such a bulk Si wafer, as Si substrates are commonly used in semiconductor device manufacturing.

In some embodiments, the techniques may be used to co-integrate Schottky diodes (formed on semipolar planes of group III-N structures) and group III-N transistors on the same substrate, such as for radio frequency (RF) applications. For instance, two Schottky diodes may be formed as described herein to be used in an electro-static discharge (ESD) circuit to protect a core RF circuit, which may include one or more power amplifier transistors, low noise amplifier transistors, and/or other suitable devices. Therefore, being able to form diodes and transistors in close proximity, such as can be done with the techniques described herein, is useful for various applications, such as an ESD plus core circuit usage. Such co-integration of one or more diodes and one or more transistors on the same substrate will be described in more detail herein with reference to FIGS. 5 and 6. In some embodiments, the techniques described herein may be used to benefit semiconductor devices of varying scales, such as devices having critical dimensions in the micrometer (micron) range and/or in the nanometer (nm) range (e.g., formed at the 22, 14, 10, 7, 5 or 3 nm process nodes, or beyond).

Method 100 of FIG. 1 includes forming 110 shallow trench isolation (STI) layer on a substrate. FIG. 2A shows an example resulting structure, where STI layer 220 was formed on substrate 210, in accordance with an embodiment. Note that FIG. 2A is a cross-sectional view of the stack of the STI layer 220 on the substrate, as can be understood based on the figure. In some embodiments, STI layer 220 may be formed 110 via one or more deposition processes, such as chemical vapor deposition (CVD), atomic layer deposition (ALD), molecular beam epitaxy (MBE), and/or any other suitable process as can be understood based on this disclosure. STI layer 220 may include any suitable insulating material, such as one or more dielectrics, oxides (e.g., silicon dioxide), or nitrides (e.g., silicon nitride). In some embodiments, the STI material 220 may selected based on the material of substrate 210 and/or based on material to be formed on/above substrate 210. For instance, in the case of a Si substrate 210, STI material 220 may be selected to be silicon dioxide or silicon nitride, to provide a few examples. In some embodiments, STI layer 220 may have any suitable thickness (dimension in the Z-axis direction), such as a thickness in the range of 20 nm to 2 microns, for example, or any other suitable thickness as will be apparent in light of this disclosure.

Substrate 210, in some embodiments, may include: a bulk substrate including a group IV material, such as silicon (Si), germanium (Ge), SiGe, or silicon carbide (SiC), and/or at least one group III-V material and/or sapphire and/or any other suitable material(s) as will be apparent in light of this disclosure; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. In some embodiments, substrate 210 may include a surface crystalline orientation described by a Miller Index of <100>, <110>, or <111>, as will be apparent in light of this disclosure. Although substrate 210, in this example embodiment, is shown as having a thickness (dimension in the Z-axis direction) similar to other layers for ease of illustration, in some instances, substrate 210 may be much thicker than the other layers, such as having a thickness in the range of 50 to 950 microns, for example, or any other suitable thickness as will be apparent in light of this disclosure. In some embodiments, substrate 210 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

Method 100 of FIG. 1 continues with forming 112 one or more openings in STI layer 210 from the structure of FIG. 2A to form the resulting example structure of FIG. 2B, in accordance with an embodiment. As shown in FIG. 2B, multiple openings were formed 112, specifically four, where two sets of two openings of the same or similar sizes were formed in this example embodiment. The first set of openings are openings 221 shown on the left side of the structure of FIG. 2B, where each opening has a width of W1 (dimension in the X direction) and where the openings are separated by a portion of STI layer 220 having a width of W2 (dimension in the X direction). In some embodiments, one or more of adjacent openings 221 may be used during LEO processing of group III-N material to form single island structures that do not merge together with other adjacent openings, where such structures have a triangular prism-like shape above the top plane of STI layer 220, as will be described in more detail herein. In some embodiments, openings 221 may include widths W1 in the range of 100 nm to 1 micron, for example, or some other suitable width as will be apparent in light of this disclosure. In some embodiments, width W2 may be in the range of 1 to 5 microns, for example, or some other suitable width as will be apparent in light of this disclosure. In some such embodiments, having a width W2 greater than 1 micron between adjacent openings 221 may help group III-N material grown from openings 221 to not merge together and thereby remain single isolated islands of material to be used for the formation of Schottky diodes, for example.

The second set of openings are openings 222 shown on the right side of the structure of FIG. 2B, where each opening has a width of W3 (dimension in the X direction) and where the openings are separated by a portion of the STI layer 220 having a width of W4 (dimension in the X direction). In some embodiments, adjacent openings 222 may be used during LEO processing of group III-N material to form merged structures, where the III-N material grown from at least two adjacent openings merges together and such merged structures have a trapezoidal prism-like shape above the top plane of STI layer 220, as will be described in more detail herein. In some embodiments, openings 222 may include widths W3 in the range of 100 to 500 nm, for example, or some other suitable width as will be apparent in light of this disclosure. In some embodiments, width W4 may be in the range of 100 nm to 1 micron, for example, or some other suitable width as will be apparent in light of this disclosure. In some such embodiments, having a width W4 less than 1 micron between adjacent openings 222 may help group III-N material grown from openings 222 to merge together, where the merged together III-N structure may include a top planar surface (e.g., that is in the polar c-plane), for example. As will be apparent in light of this disclosure, a merged-together III-N structure formed using adjacent openings (such as openings 222) may be used for the formation of Schottky diodes and/or transistors, for example. Note that although only two adjacent openings 222 will be used in this example embodiment to illustrate a merged-together III-N structure formed during LEO processing, any number of openings may be used, such as 3, 4, 5, 6, 7, 8, 9, 10, or more.

Figure 2C:
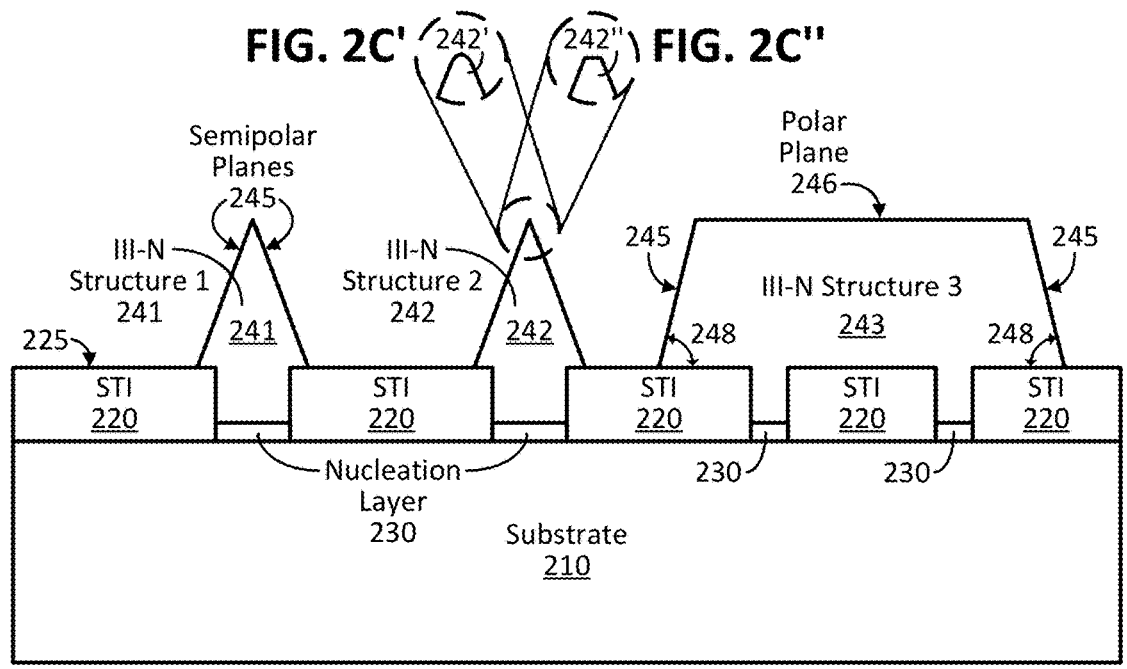

Method 100 of FIG. 1 continues with forming 114 one or more group III-N structures from STI openings 221, 222 in the structure of FIG. 2B using LEO processing to form the example resulting structure of FIG. 2C, in accordance with an embodiment. The III-N structures are referred to as such herein, because they each include group III-N semiconductor material. As shown in FIG. 2C, three III-N structures were formed 114, which include first III-N structure 241 (left-most structure), second III-N structure 242 (middle structure), and third III-N structure 3 (right-most structure). For ease of description, the last digit of the identifying numeral for each structure is the same as the number of the structure. The three III-N structures 241, 242, and 243 were formed using lateral epitaxial overgrowth (LEO) processing, whereby the III-N material was deposited on the substrate 210 through STI layer 220 in openings 221 and 222, such that the III-N material was able to grow above the top plane of the STI layer 220 to form the structure shown. In some embodiments, the III-N structures 241, 242, and 243 may have been formed using metal-organic chemical vapor deposition (MOCVD), molecular-beam epitaxy (MBE) chemical vapor deposition (CVD), atomic layer deposition (ALD), physical vapor deposition (PVD), and/or any other suitable process as will be apparent in light of this disclosure.

In this example embodiment, a nucleation layer 230 was formed prior to depositing the main III-N material of structures 241, 242, and 243. Therefore, in this example embodiment, III-N structures 241, 242, and 243 are formed on nucleation layer 230 and above substrate 210. However, nucleation layer 230 is optional, but in embodiments where it is present (such as in the embodiment of FIG. 2C), it may be included to, for example, improve growth conditions and/or prevent subsequently deposited III-N material from reacting with the substrate material in an undesired manner. In some such embodiments, the nucleation layer, where present, may include III-V or III-N material, such as AlN or a low temperature GaN layer (e.g., epitaxially grown at a temperature in the range of 700 to 950 degrees Celsius), for example. In some embodiments, the nucleation layer, where present, may have any suitable thickness (dimension in the Z-axis direction), such as a thickness of 10 nm to 2 microns (e.g., 20 nm to 1 micron), or any other suitable thickness as will be apparent in light of this disclosure. Note that in some embodiments, where nucleation layer 230 is not present, III-N structures 241, 242, and 243 may be formed directly on substrate 210, for example.

III-N structures 241, 242, and 243, in some embodiments, may include any suitable III-N material, such as GaN or InGaN, or any other suitable group III-N semiconductor material, as will be apparent in light of this disclosure. As previously described, III-N material, as used herein, includes a compound of one or more group III elements (e.g., aluminum, gallium, and/or indium), with nitrogen. Accordingly, III-N materials as variously used herein include, but are not limited to, GaN, InN, AlN, AlInN, AlGaN, InGaN, and AlInGaN. In some embodiments, GaN may be particularly well-suited for III-N structures 241, 242, and 243 because of its wide bandgap, high critical breakdown electric field, and high electron saturation, for example. For instance, embodiments employing GaN for the material of the III-N structures 241, 242, and 243 may be particularly well-suited for high-voltage and high-frequency applications, such as in the context of RF circuitry (e.g., including Schottky diodes, power amplifier transistors, and low-noise amplifier transistors, to name some example devices). In some embodiments, III-N structures 241, 242, and 243 may have a multilayer structure including multiple III-N materials. In some embodiments, III-N structures 241, 242, and 243 may or may not include grading (e.g., increasing and/or decreasing) the content of one or more materials in at least a portion of the layer. In some embodiments, III-N structures 241, 242, and 243 may be doped with another material, such as with one or more suitable p-type or n-type dopants, for example. In some embodiments, III-N structures 241, 242, and 243 may be formed to have a thickness (the dimension in the Z-axis direction) between 20 nm and 2 microns, or any other suitable thickness, as will be apparent in light of this disclosure. Note that the thickness of the III-N structures 241, 242, and 243 may be measured as the thickness above substrate 210, above STI layer 210, or above nucleation layer 230 (where present), for example.

As can be understood based on this disclosure, all of III-N structures 241, 242, and 243 may have been formed at the same time, via LEO processing. Although the three structures are shown having relatively similar thicknesses or heights (dimension in the Z-axis direction), the present disclosure is not intended to be so limited and the structures may not, in practice, have such conditions, especially where all three structures are formed during the same LEO processing scheme. For instance, in some such cases, structures 241 and 242 may grow to be taller or shorter than structure 243. Also note that although III-N material is not shown as being independently formed on STI layer 220 (e.g., the III-N material is only on STI layer 220 where the III-N structures spill over onto portions of STI layer 220 or merge together on an STI 220 portion between two adjacent opening therein), in some cases, III-N material may grow (at least partially) on STI layer 220. However, such III-N material that grows directly on STI layer 220 during the formation of III-N structures 241, 242, and 243 will generally be of particularly low quality and/or have a low potential of actually staying on the STI material (e.g., low sticking coefficient), such that it can be easily cleaned off or otherwise removed if desired.

As can be understood based on this disclosure, III-N structures 241, 242, and 243 each include semipolar planes 245, one or more of which may be used to effectively form a Schottky diode, as will be described in more detail herein. In other words, the semipolar planes 245 are the sidewalls of the III-N structures 241, 242, and 243 formed using LEO processing. Further, III-N structure 243 includes polar plane 246 that may be used in some embodiments to effectively form a transistor, as will also be described in more detail herein. In some embodiments, the semipolar planes 245 of III-N structures 241, 242, and 243 may be defined by the Miller-Bravais indices of those semipolar planes, where such Miller-Bravais indices include, but are not limited to, {11-22}, {10-11}, {10-13}, {10-1-3}, {1-101}, and {10-1-1}. The Miller-Bravais indexing system can be used for hexagonal lattice systems, such as for GaN material structures. Note that the use of (hkil) represents a family of lattice planes in the Miller-Bravais system represented by four integers h, k, i, and l, as is known in the art, and that the use of {hkil} denotes the set of all planes that are equivalent to (hkil) by the symmetry of the lattice. Therefore, {10-11} includes (10-11) and equivalents thereof, to provide an example. In some embodiments, the semipolar planes 245 may be defined based on the inter-planar angle relative to a polar c-plane (e.g., having a Miller-Bravais index of (0001)

or (000-1)) and/or relative to the top plane of the STI layer (indicated as 225), where the inter-planar angles may be in the range of 15 to 80 degrees, for example. For instance, using the specific semipolar planes having Miller-Bravais indices of (11-22) and (10-13), the corresponding inter-planar angles relative to the c-plane are 58.43 and 32.06 degrees, respectively, to provide a few examples. In addition, inter-planar angles 248 are shown in FIG. 2C, where the angle is between the top plane of STI layer 220 and the semipolar planes 245 of III-N structure 243, where the angles are both approximately 75 degrees, and thus, the semipolar planes may have a Miller-Bravais index of (10-1-2), for example.

Note that, for the purposes of the 15 to 80 degree inter-planar range, the inter-planar angle is the smallest angle between the two planes being compared. For example, although the inter-planar angle may also be considered to be approximately 105 degrees between the left semipolar plane 245 of III-N structure 243 and the top plane of the STI layer 220, the smaller angle of approximately 75 degrees should be used to determine if the inter-planar angle is within the 15 to 80 degree range. Also note that although semipolar planes 245 (e.g., of structures 241, 242, and 243) are referred to collectively herein, they need not all have the same Miller-Bravais index or angle of inclination relative to a polar c-plane (or angle of inclination relative to the top plane of the STI layer). For instance, for III-N structures such as 241 and 242 that have two semipolar planes 245 (the two sides of each structure), the two semipolar planes need not be equivalent. Further, the angles of inclination of semipolar planes from III-N structure to III-N structure on the same substrate may differ based on a multitude of variables, such as the size of the opening in the STI layer from which they were grown, growth conditions, and so forth.

The semipolar planes 245 of III-N structures 241, 242, and 243 can be contrasted to nonpolar planes of III-N structures, which are generally in the range of 85 to 95 degrees relative to the polar c-plane and/or relative to the top plane of the STI layer. Two such families of nonpolar planes in III-N structures are the a-planes, which include the planes represented by the Miller-Bravais index of {11-20}, and the m-planes, which include the planes represented by the Miller-Bravais index of {10-10}. As previously described, planar surfaces (e.g., polar c-plane surfaces) are typically more suitable for III-N transistor fabrication, as a relatively thicker polarization charge inducing layer can be formed on such planar surfaces (e.g., compared to semipolar planes), thereby allowing for the formation of a 2DEG configuration with a relatively larger charge. Such a planar or polar plane may be approximately parallel to the top plane of STI layer 220, for example. However, semipolar planes can be suitable for Schottky diode fabrication. Therefore, III-N structures lacking a planar surface (or a polar c-plane surface), such as those formed from single STI openings (e.g., III-N structures 241 and 242), can be used for the formation of Schottky diodes, as will be apparent in light of this disclosure.

As shown in FIG. 2C, the III-N structures formed from one opening in STI layer 220 using LEO processing (structures 241 and 242 in this example embodiment), have triangular prism-like shapes above the top plane of the STI layer 220 (where the top plane is indicated as 225). Note that this is shown as a triangle shape in the cross-sectional view of FIG. 2C (the triangular prism-like shape can be better seen in FIG. 3A). However, III-N structures having other shapes may be formed using only a single opening in the STI layer, based on the LEO processing conditions. For instance, in some embodiments, the top of the triangular prism-like shape of structures 241 and 242 need not come to a pointed or angled vertex/corner like the example shapes shown in FIG. 2C. FIGS. 2C' and 2C", which are both blown-out views of the top of the second III-N structure 242, show two alternative shapes for the top of the triangular prism-like shape that may form from a single STI opening during LEO processing. As shown in FIG. 2C', alternative triangular prism-like structure 242' has a top vertex/corner that is rounded or curved, and as shown in FIG. 2C", alternative triangular prism-like structure 242" has a top vertex/corner that is flat or plateau-like. Variations of the shape may also occur at the bottom of the sidewalls of the III-N structures, as III-N material may accumulate at those locations, for example. Numerous variations on the shape and size of III-N structures formed using LEO processing may occur and the present disclosure is not intended to be limited to any specific shape or size, unless otherwise stated.

Figure 2D:
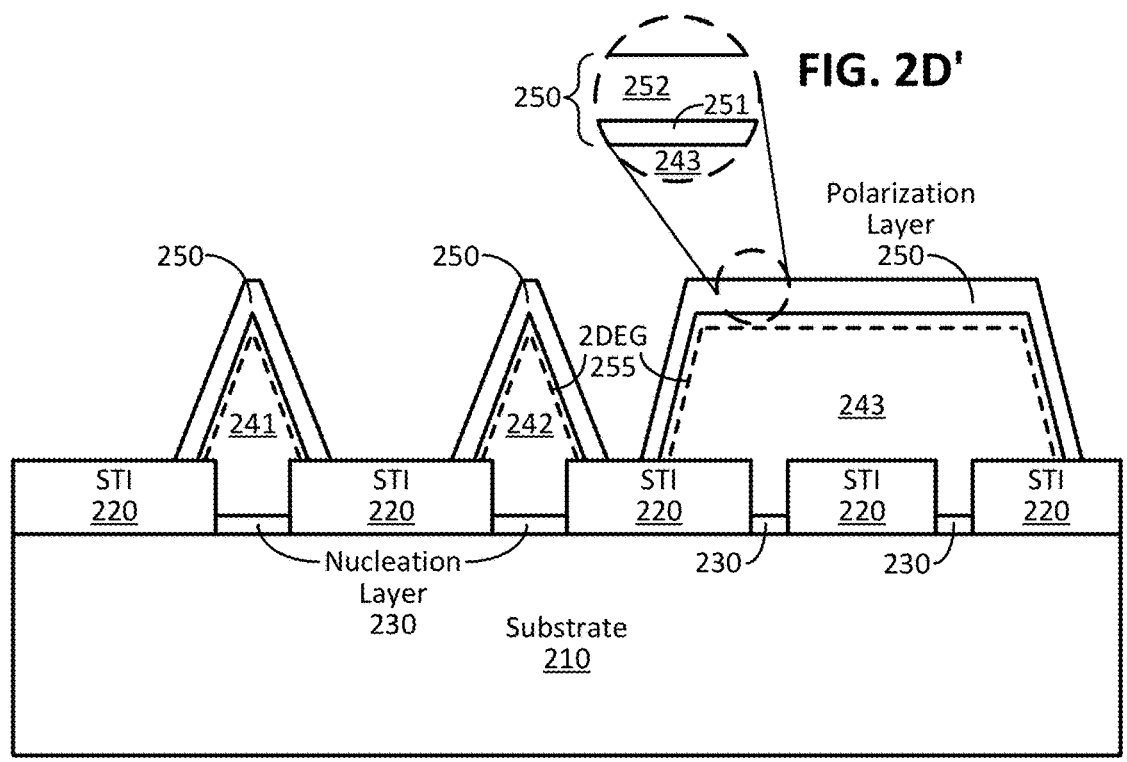

Method 100 of FIG. 1 continues with forming 116 polarization charge inducing layer 250 on the semipolar planes 245 of the III-N structures of FIG. 2C to form the resulting example structure of FIG. 2D, in accordance with an embodiment. In some embodiments, polarization charge inducing layer 250 may be formed 116 using any suitable techniques, such as any of the previously mentioned deposition processes (e.g., MOCVD, MBE, CVD, ALD, PVD), and/or any other suitable process as will be apparent in light of this disclosure. In some embodiments, polarization charge inducing layer 250 may include any suitable materials, such as one or more III-V materials, and more specifically in some embodiments, one or more III-N materials, for example. In some embodiments, polarization charge inducing layer 250 may include aluminum, such that the layer includes at least one of AlN, AlGaN, AlInN, and AlInGaN, for instance. In this example embodiment, polarization charge inducing layer 250 is formed on III-N structures 241, 242, and 243, it may be used to form a two-dimensional electron gas (2DEG) configuration 255 with the underlying III-N structure. As such, polarization charge inducing layer includes material having a higher bandgap than the material of the underlying III-N structures. For instance, in some embodiments, III-N structures 241, 242, and 243 may include GaN and polarization charge inducing layer 250 may include AlN and/or AlGaN, for example. Note that such a scheme causing a 2DEG configuration may be referred to as polarization doping and thus, that polarization charge inducing layer 250 may be referred to herein as a polarization layer. Also note that the 2DEG configuration 255 is represented by dashed lines in the III-N structures 241, 242, and 243 as shown in FIG. 2D.

In some embodiments, polarization charge inducing layer 250 may have a multilayer structure including multiple III-V materials. For example, FIG. 2D' is a blown-out view of a portion of the third III-N structure 243 and polarization charge inducing layer 250 illustrating a multilayer polarization layer 250 that includes layers 251 and 252, as shown. In such an embodiment where the polarization layer is a multilayer structure, layer 251 may include AlN and layer 252 may include AlGaN, for example. In some embodiments, polarization charge inducing layer 250 may or may not include grading (e.g., increasing and/or decreasing) the content of one or more materials in at least a portion of the layer. In some embodiments, polarization charge inducing layer 250 may have a thickness (the dimension in the Z-axis direction) of 0.1 to 100 nm (e.g., 0.5 to 5 nm), or any other suitable thickness, as will be apparent in light of this disclosure. In embodiments where the polarization charge inducing layer 250 has a multilayer structure (e.g., including layers 251 and 252 as shown in FIG. 2D'), the layer closest to the underlying III-N structure (such as layer 251) may be relatively thinner than other layers in the multilayer structure (such as layer 252). As previously described, relatively thicker polarization charge inducing layers may be able to be formed on planar planes, such as polar plane 246 of III-N structure 243, as compared to semipolar planes 245, as is shown in FIG. 2D. Such relatively thicker polarization layers are desired for transistor fabrication. However, the polarization charge inducing layer 250 that is able to form on semipolar planes 245 of the III-N structures 241, 242, and 243 is suitable for Schottky diode fabrication, allowing for Schottky diodes to be formed using III-N structures formed from single STI openings during LEO processing (such as III-N structures 241 and 242).

Method 100 of FIG. 1 may continue with optionally removing 118 the polarization charge inducing layer from regions to be used as source and drain (S/D) regions and regrowing S/D region material (such as n-type III-N material), in accordance with some embodiments.

Figure 3A:
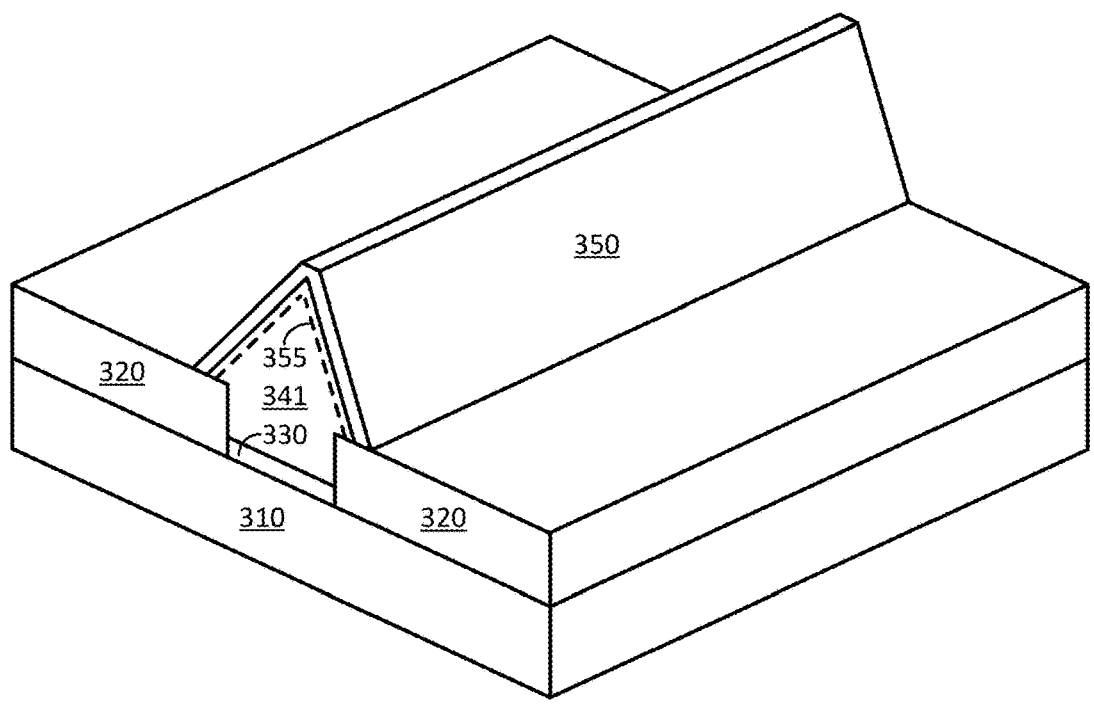
FIGS. 3A-B illustrate perspective views of example IC structures formed when carrying out the method of FIG. 1 to complete formation of a Schottky diode device, in accordance with an embodiment of the present disclosure. Note that the structure of FIG. 3A continues from a similar structure as shown in FIG. 2D to assist with illustrating an embodiment of the method of FIG. 1.

Such an optional process will be described in more detail below with reference to FIGS. 4A-D. However, whether or not optional process 118 is performed (which it need not be), method 100 of FIG. 1 continues with completing 120 Schottky diode formation, including forming the gate (e.g. the Schottky gate) and joined together (or otherwise electrically connected) S/D regions. For ease of illustration, the example structures of FIGS. 3A-B and 4A-D are views of a single III-N structure formed from a single STI opening using LEO processing, and more specifically, III-N structure 341 which is similar to III-N structure 241 described herein. Further, the example structures of FIGS. 3A-B and 4A-D include similar features as the example structure of FIG. 2D, except that the features are renumbered from the 200s to the 300s. For instance, substrate 210 is renumbered to substrate 310, STI layer 220 is renumbered to STI layer 330, and so forth. Accordingly, the previous relevant description with respect to the features shown in FIGS. 2A-D is equally applicable to the features shown in FIG. 3A. Moreover, only one III-N structure is shown in FIG. 3A, for ease of description, which is III-N structure 341 (similar to III-N structure 241, as previously described). Just as III-N structure 241 has a triangular prism-like shape above the top plane of the STI layer, III-N structure 341 also has a triangular prism-like shape above the top plane of the STI layer, as can be seen in FIG. 3A.

Continuing from FIG. 3A, and without having performed optional process 118, method 100 of FIG. 1 includes completing 120 Schottky diode formation by forming gate 360, source contact 370, and drain contact 371, and joining together (and electrically connecting) the S/D regions 370 and 371 via S/D connected contact 372, in accordance with an embodiment. In this manner, the Schottky diode is a two terminal semiconductor device including a first terminal of the gate 360 (at gate contact 362) and a second terminal of the joined together S/D contacts 370 and 371 at S/D connected contact 372. Note that, in embodiments where the final device formed is a Schottky diode, gate 360 is a Schottky gate (and thereby forms a Schottky barrier), as can be understood based on this disclosure. The formation of features 360, 362, 370, 371, and 372 may be performed using any suitable techniques, such as using one or more of the deposition processes described herein (e.g., CVD, ALD, MBE) and/or any other suitable process as will be apparent in light of this disclosure. Note that, in some embodiments, features 360, 362, 370, 371, and 372 need not be formed in any particular order. Although, in some embodiments, features 370 and 371 may be formed simultaneously with or prior to forming feature 372. Further, in some embodiments, feature 360 may be formed simultaneously with or prior to forming feature 362. Numerous fabrication variations will be apparent in light of this disclosure.

Figure 3B:
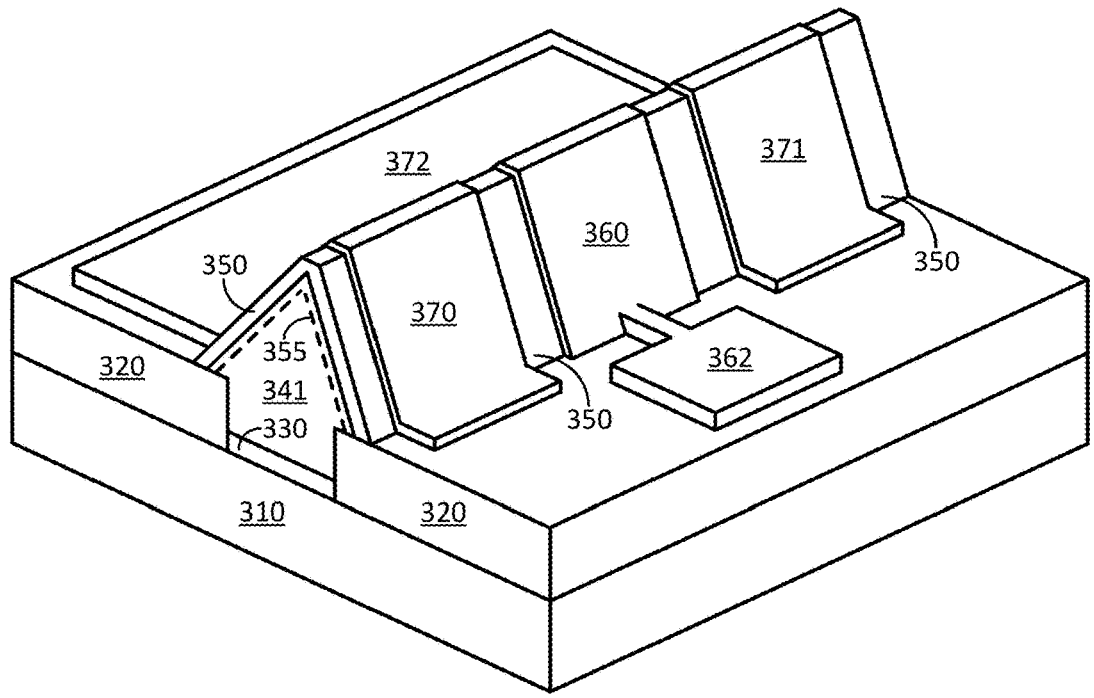

Recall that in this example embodiment, polarization layer 350 was not removed from the S/D regions, such that it is present under S/D regions 370 and 371 in the example structure of FIG. 3B, and more specifically in this example embodiment, S/D regions 370 and 371 were formed on polarization layer 350, which was formed on semipolar planes of III-N structure 341. Therefore, 2DEG configuration 355 exists below S/D contacts 370 and 371 in this example embodiment and acts as the source and drain regions for the structure. In other words, in this example embodiment, source contact 370 defines the source region, as contact 370 is above the source region of the III-N structure 341, and drain contact 371 defines the drain region, as contact 371 is above the drain region of the III-N structure 341. As can also be understood, polarization layer 350 is present under gate 360 (e.g., a Schottky gate), and more specifically in this example embodiment, gate 360 was formed on polarization layer 350, which was formed on semipolar planes of III-N structure 341. Note that, in this example embodiment, the S/D regions may include the features specifically indicated as 370 and 371, as well as the portions of polarization layer 350 and III-N structure 341 underneath features 370 and 371. Regardless, features 370 and 371 define (or at least help define) the S/D regions to be joined together (or otherwise electrically connected) to be used for one terminal of a Schottky diode, as can be understood based on this disclosure. It can be further understood that the S/D regions (whether that be features 370 and 371 and/or the portions below features 370 and 371) are adjacent to two sides of gate 360 (albeit the S/D regions need not be directly adjacent), and specifically in this embodiment, adjacent to opposing sides of gate 360, as shown in FIG. 3B.

S/D contacts 370 and 371 and S/D connected contact 372, in some embodiments, may include any suitable material, such as a conductive material, such as a metal or metal alloy (e.g., aluminum, tungsten, silver, nickel-platinum, or nickel-aluminum). In some embodiments, contacts 370, 371 and/or 372 may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in contact regions 370, 371, and/or 372, such as adhesion layers (e.g., titanium nitride) and/or liner or barrier layers (e.g., tantalum nitride), if so desired. Further, in some embodiments, contact 370, 371, and/or 372 may have a multilayer structure including multiple materials. In some embodiments, contact 370, 371, and/or 372 may or may not include grading (e.g., increasing and/or decreasing) the content of one or more materials in at least a portion of one or more of the features. Note that S/D contacts 370 and 371 are tied or connected together by merged S/D contact 372, where that merged contact is primarily (or completely) formed on STI layer 320 in this example embodiment;

however, the present disclosure is not intended to be so limited. Also note that S/D contacts 370 and 371 need not be merged or joined together at S/D connected contact 372 as shown in FIG. 3B. For example, in some embodiments, S/D contacts 370 and 371 may be merged from above or in some other suitable manner, and in some such embodiments, S/D connected contact feature 372 need not be present.

Gate 360 and gate contact 362, in some embodiments, may include any suitable material, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. Recall that because gate 360 is being used for a Schottky diode, it may be a Schottky gate and thus include characteristics of a Schottky barrier, in some embodiments. In some embodiments, gate 360 and/or gate contact 372 may have a multilayer structure including multiple materials. In some embodiments, gate 360 and/or gate contact 372 may or may not include grading (e.g., increasing and/or decreasing) the content of one or more materials in at least a portion of one or both of the features. Note that gate contact 362 is primarily (or completely) formed on STI layer 320 in this example embodiment; however, the present disclosure is not intended to be so limited. Also note that gate contact 362 need not be merged with gate 360 as shown in FIG. 3B. For example, in some embodiments, the two features 360 and 362 may be otherwise electrically connected. Further note that in some embodiments, gate 360 may be contacted from above and thus need not include gate contact feature 362, for example.

Figure 4A:
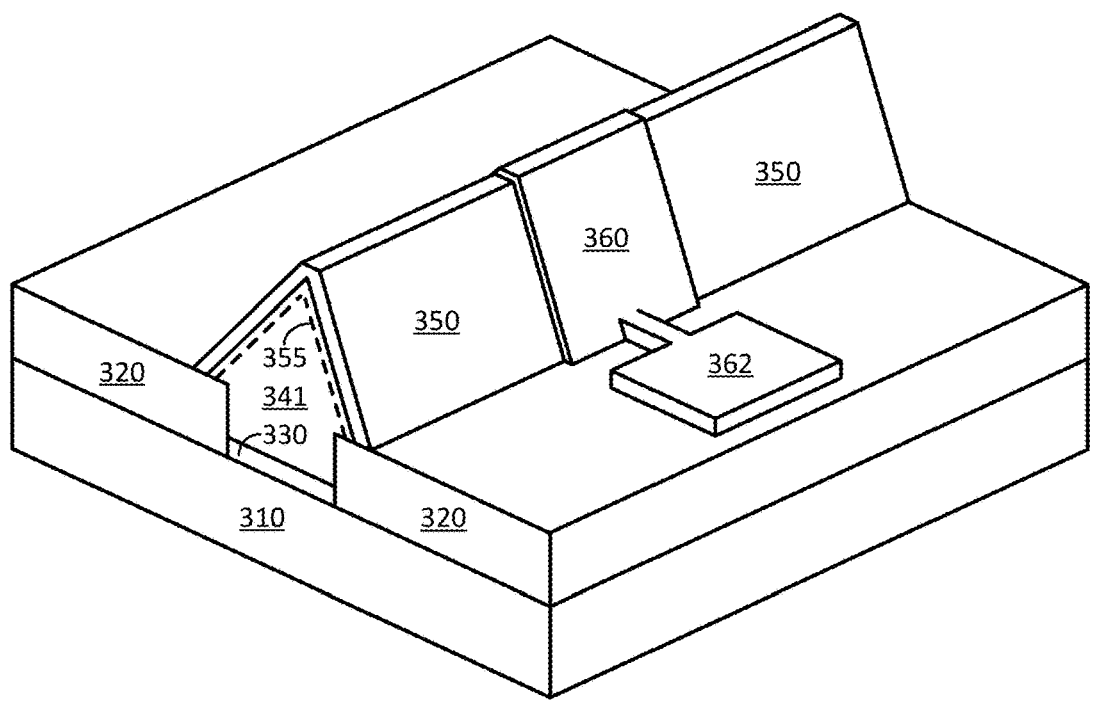
FIGS. 4A-D illustrate perspective views of example IC structures formed when carrying out the method of FIG. 1 to complete formation of a Schottky diode device, in accordance with another embodiment of the present disclosure. Note that the structure of FIG. 4A continues from the structure of FIG. 3A to assist with illustrating an embodiment of the method of FIG. 1.
Figure 4B:
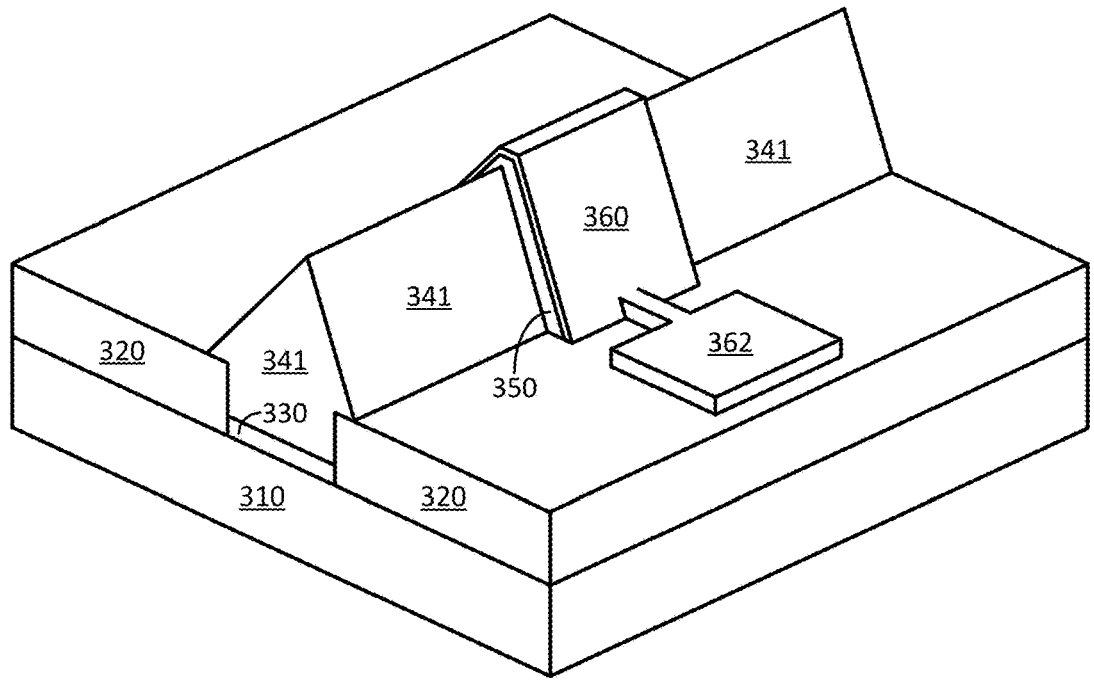

Continuing from FIG. 3A, and with performing optional process 118, method 100 of FIG. 1 includes forming gate 360 to establish a gate region and also establish source and drain regions on either side of the gate 360, thereby forming the resulting example structure of FIG. 4A, in accordance with an embodiment. As can also be seen in FIG. 4A, gate contact 362 was also formed on the structure of FIG. 3A. Optional process 118 continues in this embodiment with removing polarization charge inducing layer 350 from the source and drain regions to form the resulting example structure of FIG. 4B. Removal of polarization layer 350 may be performed using any suitable techniques, such as etching the polarization layer 350 in the exposed areas, for example. As can be seen in FIG. 4B, gate 360 may have operated as a mask during such an etching process, allowing for the polarization layer 350 to substantially remain under gate 360 as shown. Removal of polarization layer 350 exposes the III-N structure 341 on both sides of gate 360. In addition, 2DEG configuration 355 is no longer present in the locations where polarization layer 350 was removed; however, it would still be present in, for example, the location under gate 360, in this embodiment.

Figure 4C:
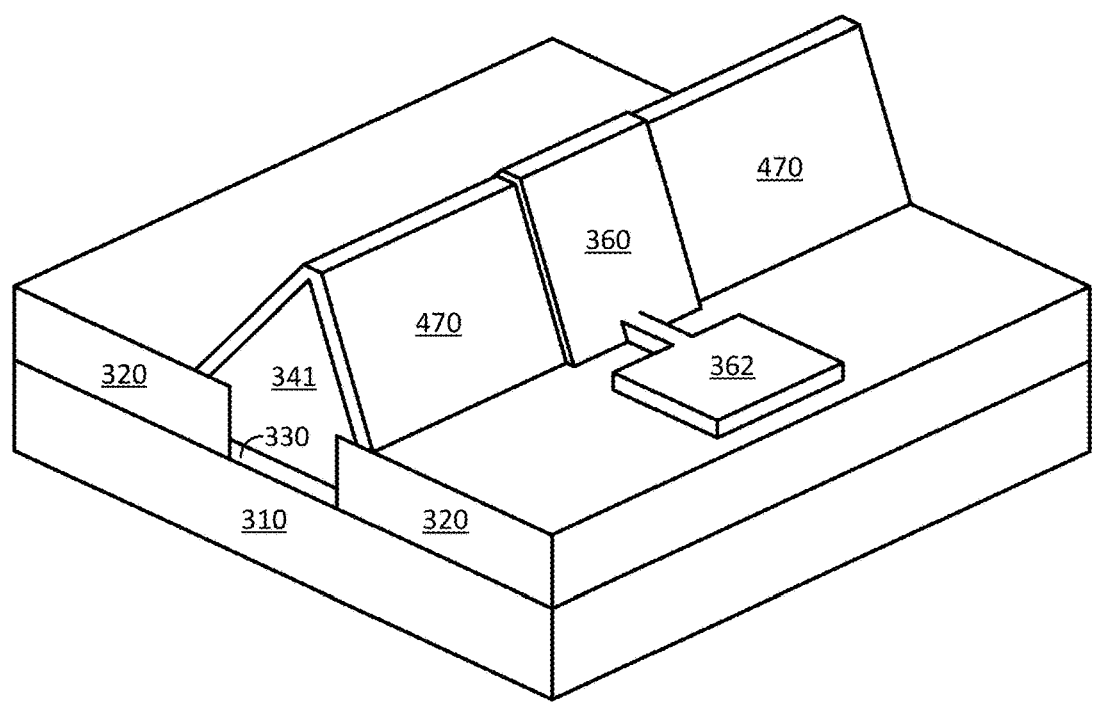

Optional process 118 continues in this embodiment with forming replacement source/drain (S/D) material 470 in the locations to be used for the source and drain of the structure to form the example structure of FIG. 4C, in accordance with an embodiment. Replacement S/D layer 470 may be formed using any suitable techniques, such as one or more of the deposition processes described herein (e.g., MOCVD, MBE, CVD, ALD, PVD), and/or any other suitable process as will be apparent in light of this disclosure. For example, in some embodiments, replacement S/D layer 470 may be formed by any combination of optional patterning/masking/lithography/etching with depositing/growing/regrowing the replacement S/D layer 470, for instance. Note that replacement S/D layer 470 is referred to as replacement material because it is replacing polarization layer 350 which could also be used for the source and drain (e.g., as discussed with reference to FIG. 3B). However, such a replacement designation is not intended to be limiting. With reference to the structure of FIG. 4B, replacement S/D layer 470 may only grow (or effectively grow) on the exposed surfaces of III-N structure 341, such that the S/D layer may not grow or may grow in a low-quality manner on the STI layer 320 surfaces and surfaces of features 360 and 362. However, in FIG. 4C, material of the replacement S/D layer 470 is shown as only present on III-N structure 341 (e.g., it only grew or primarily grew on the III-N material of structure 341). Where the III-N material does grow elsewhere (e.g., on 320, 360, and/or 362), it may be easily cleaned or otherwise removed, if so desired.

In some embodiments, the replacement S/D layer 470 may include any suitable material, such as III-V material, III-N material, and/or any other suitable material(s), as will be apparent in light of this disclosure. In addition, in some embodiments, the replacement S/D layer 470 may be doped in an n-type or p-type manner, for example, using any suitable doping techniques. In an example embodiment, the replacement S/D layer 470 includes indium and nitrogen (e.g., InN and/or InGaN) and is doped in an n-type manner (e.g., using Si, Se, and/or Te). Further, in such an example embodiment, the replacement S/D layer may include such n-type impurity dopants in the amount of around 2E20 per cubic cm, for instance. In some embodiments, replacement S/D layer 470 may have a multilayer structure including multiple materials. In some embodiments, replacement S/D layer 470 may or may not include grading (e.g., increasing and/or decreasing) the content of one or more materials in at least a portion of the layer. Note that although both of the regions intended to be the source and drain regions include the same replacement layer 470 in this example embodiment, in other embodiments, the source region may include different material than the drain region, for example.

Figure 4D:
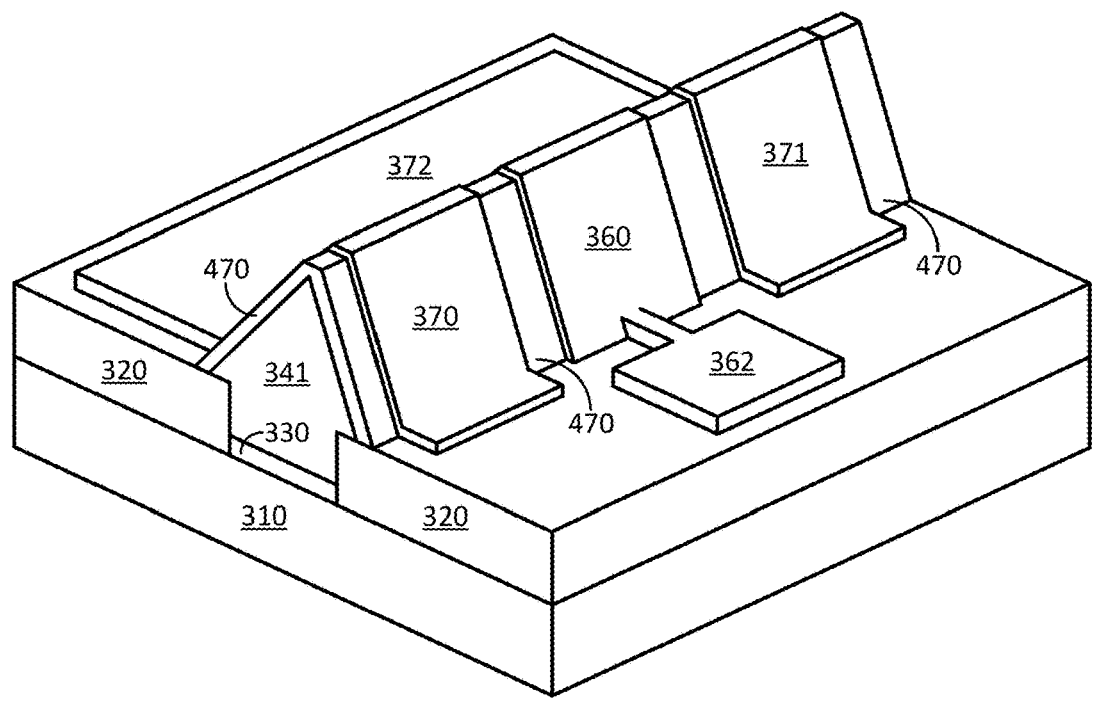

After the replacement S/D layer 470 has been grown to form the example structure of FIG. 4C, method 100 of FIG. 1 can continue with completing 120 the Schottky diode formation, including forming gate 360 (e.g., a Schottky gate) and connected S/D to form the resulting example structure of FIG. 4D. The previous relevant description with respect to process 120 is equally applicable here, and with respect to features 370, 371, 372, 360, and 362, which were described with respect to FIG. 3B. Note that a primary difference between the structure of FIGS. 4D and 3B is that, in the structure of FIG. 3B, the polarization layer 350 is present under S/D contacts 370 and 371, thereby forming a 2DEG configuration with the underlying III-N structure 341, whereas in the structure of FIG. 4D, the polarization layer 350 was removed and replaced with replacement S/D layer 470, such that the polarization layer 350 is not present below S/D contacts 370 and 371 in that example embodiment. In the structure of FIG. 4D, replacement S/D layer 470 may be impurity doped (e.g., with suitable n-type dopants) to modulate its electrical properties, especially where the 2DEG configuration is lost as a result of removing polarization layer 350 in those locations. Also note that in both embodiments of FIGS. 3B and 4D, polarization layer 350 remains under gate 360.

As can be understood based on this disclosure, both of the structures of FIGS. 3B and 4D can effectively be used as a Schottky diode. As can also be understood, the present disclosure is not intended to be limited to forming Schottky diodes using III-N structures formed from single STI openings during LEO processing. For example, in some embodiments, the techniques described herein (e.g., using method 100 of FIG. 1) can be used to form a Schottky diode using a III-N structure formed from multiple adjacent STI openings during LEO processing. For instance, in such an embodiment, III-N structure 243 of FIG. 2D may be used to form the Schottky diode, where semipolar planes 245 of that structure can be used to form the device. In such an example embodiment, features 370, 371, and 360 may also span the top polar plane 246 of that III-N structure 243, where those features are on both of the semipolar planes 245 of the structure 243. Numerous variations and configurations for Schottky diode formation using one or more sidewalls and/or semipolar planes of III-N structures will be apparent in light of this disclosure.

Figure 5A:
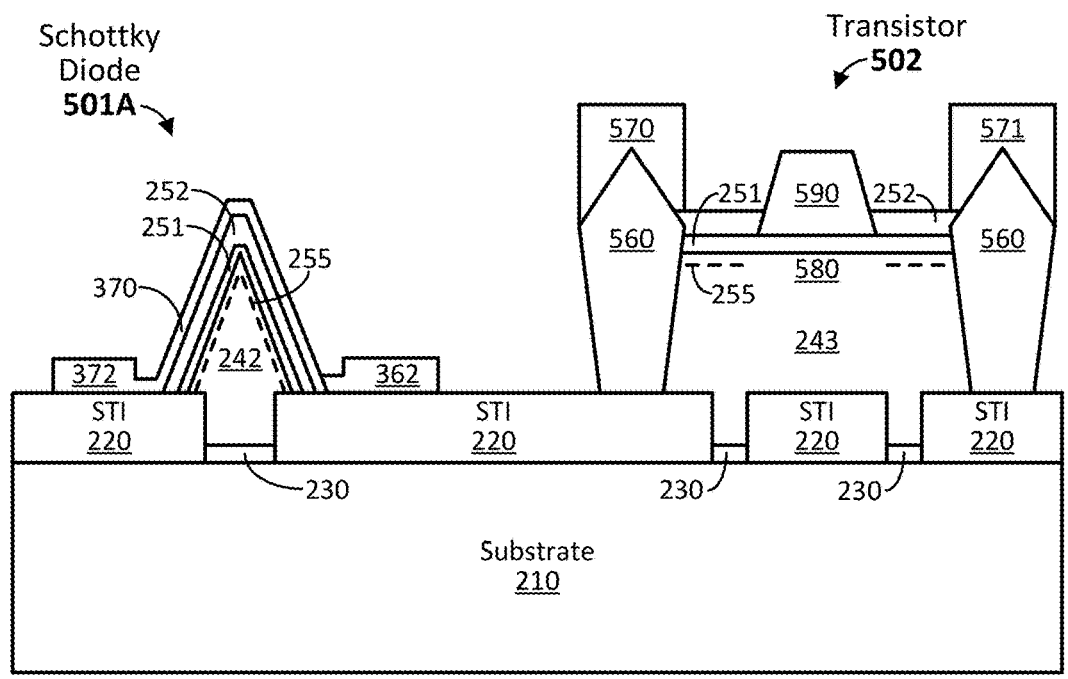
FIGS. 5A-B illustrate cross-sectional views of example IC structures including a Schottky diode formed on semipolar planes of a III-N structure and a III-N transistor, in accordance with some embodiments of the present disclosure. Note that FIGS. 5A-B are cross-sectional views of the stack of the STI layer on the substrate, and features formed thereon.
Figure 5B:
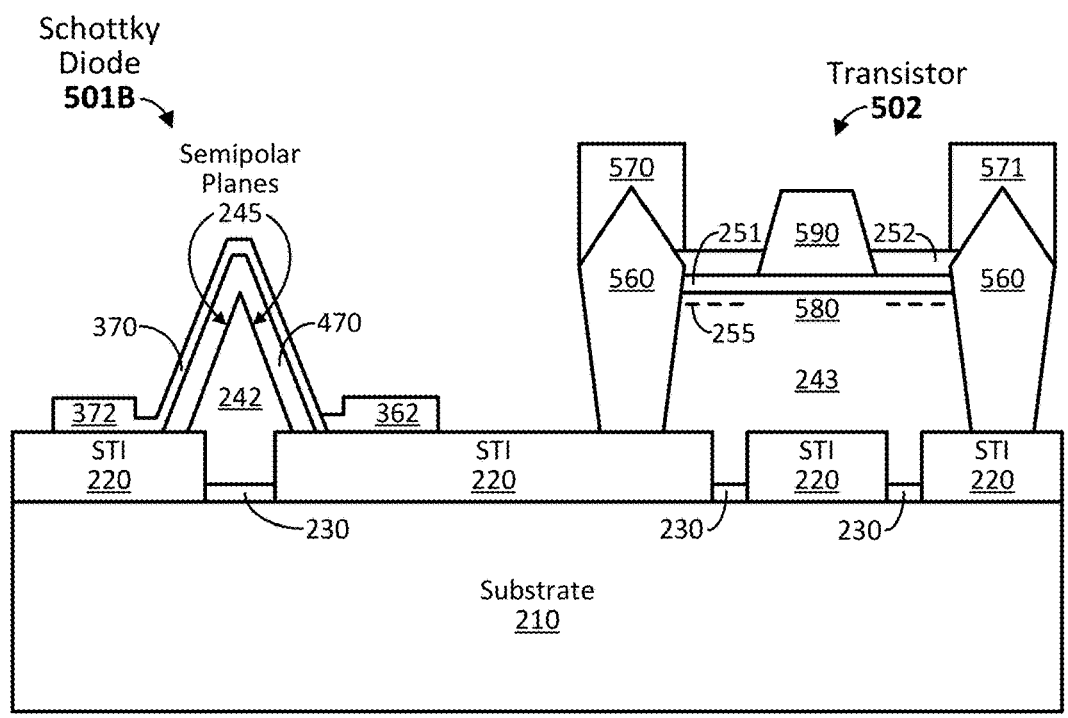

FIGS. 5A-B illustrate cross-sectional views of example IC structures including a Schottky diode formed on semipolar planes of a III-N structure and a III-N transistor, in accordance with some embodiments of the present disclosure. The example structure of FIG. 5A combines features from the example structures of FIGS. 2D and 3B to illustrate how a Schottky diode can be formed in close proximity to a III-N transistor for a multitude of applications. Further, the example structure of FIG. 5B combines features from the example structures of FIGS. 2D and 4D to illustrate how a Schottky diode can be formed in close proximity to a III-N transistor for a multitude of applications. The views of FIGS. 5A-B are similar to that of FIG. 2D, except that only III-N structures 242 and 243 are shown for ease of description. Accordingly, the previous relevant description of features in FIGS. 5A-B (e.g., substrate 210, STI layer 220, nucleation layer 230, and so forth) is equally applicable to the structures of FIGS. 5A-B. As can be understood based on this disclosure, III-N structure 242 in FIG. 5A was formed into a Schottky diode 501A device using similar techniques that arrived at the structure of FIG. 3B (e.g., polarization layer 251/252 is present between S/D contacts 370, 371 and III-N structure 242). Further, as can also be understood based on this disclosure, III-N structure 242 in FIG. 5B was formed into a Schottky diode 501B device using similar techniques that arrived at the structure of FIG. 4D (e.g., polarization layer 250 or 251/252 is not present between S/D contacts 370, 371 and III-N structure 242, but was removed and replaced by replacement S/D layer 470). Note that the Schottky diodes 501A and 501B were formed using a III-N structure 242 that was formed using a single STI opening, and therefore, the III-N structure 242 has a substantially triangular shape above the top plane of STI layer 220 in the cross-sectional views of FIGS. 5A-B, as shown in these example embodiments.

With reference to the transistor 502 formed using III-N structure 243, which is the device on the right side of the IC structure of FIGS. 5A-B, the processing to arrive at the transistor device may include any suitable techniques as can be understood based on this disclosure. For instance, in some embodiments, transistor 502 may be formed by continuing with the structure of FIG. 2D (and specifically using the multilayer polarization layer 250 that includes layers 251 and 252), removing portions of the polarization layer 251/252 and the III-N structure 243 on both sides of the structure and forming (or growing or regrowing) the material of S/D regions 560, followed by forming S/D contacts 570 and 571, and also removing a portion of polarization layer 252 and forming gate 590, to form the example transistor structure 502 of FIGS. 5A-B. In some embodiments, the one or more portions of the fabrication of transistor 502 may be performed during the processing of Schottky diode 501A or 501B. For instance, in an example embodiment, when growing replacement S/D layer 470 to form Schottky diode 501B, the same material may be grown simultaneously for the S/D regions 560 of transistor 502. To provide another example, the same metal or metal alloy (or other electrically conductive material) may be used for both gate 360 (which may be a Schottky gate) of 501A/501B and gate 590 of transistor 502, and thus, they may be processed simultaneously. To provide yet another example, the same metal or metal alloy (or other electrically conductive material) may be used for both S/D contacts 370, 371 of 501A/501B and S/D contacts 570, 571 of transistor 502. Therefore, numerous processing efficiencies can be gained from forming a Schottky diode as described herein to be used with a III-N transistor for a multitude of applications. As such, transistor 502 may be used for various purposes (e.g., various RF applications), such as a power amplifier transistor, a low-noise amplifier transistor, or any other suitable purpose as will be apparent in light of this disclosure.

In some embodiments, S/D regions 560 of transistor 502 may include any suitable material and be formed using any suitable techniques, such as similar material and processing techniques as described herein with reference to replacement S/D layer 470, for example. In some embodiments, S/D contacts 570 and 571 of transistor 502 may include any suitable material and be formed using any suitable techniques, such as similar material and processing techniques as described herein with reference to S/D contacts 370 and 371, for example.

In some embodiments, gate 590 of transistor 502 may be formed using any suitable techniques, such as removing a portion of polarization layer 250 (e.g., of polarization layer 252 of multilayer polarization layer 250, in the example cases of FIGS. 5A-B) to then allow for the formation of the gate stack. Note that gate 590 defines and is above channel region 580 as indicated. Also note that the removal of polarization layer 252 in this example case results in the 2DEG configuration not being present in the portion of III-N structure 243 below gate 590. In some embodiments, the gate stack may include a gate dielectric layer (not shown) below gate 590. In some embodiments, gate dielectric layer may include silicon dioxide and/or high-k dielectric material, or any other suitable gate dielectric material. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. In some embodiments, an annealing process may be carried out on the gate dielectric layer to improve its quality when a high-k material is used, for example.

In some embodiments, gate 590 of transistor 502 may include any suitable material, such as the material described herein with reference to gate 360, for example. The previous relevant description with respect to gate 360 is equally relevant to gate 590. In some embodiments, one or more material layers may be formed between the gate dielectric layer and the gate 590 to, for example, increase the interface quality between the two features and/or to improve the electrical properties between the two features. Such intervening layers may include one or more work-function material layers, for example. In some embodiments, gate dielectric layer and/or gate 590 may include a multi-layer structure of two or more material layers. In some embodiments, gate dielectric layer and/or gate 590 may include grading (e.g., increasing and/or decreasing) the content of one or more materials in at least a portion of the layer(s).

Numerous gate stack configurations will be apparent in light of this disclosure and the present disclosure is not intended to be limited to any particular configuration unless otherwise stated. In some embodiments, spacer material (not shown) may be present on either side of gate 590, and such spacer material include any suitable material, such as dielectric material, oxide material (e.g., silicon oxide) and/or nitride material (e.g., silicon nitride), for example. Additional suitable processing may be performed, such as back-end or back-end-of-line (BEOL) processing to form one or more metallization layers and/or to interconnect the devices 501A/501B, 502 as desired.

Transistor 502 may be formed to have any suitable transistor geometry and configuration, including, but not limited to, a field-effect transistor (FET), a metal-oxide-semiconductor FET (MOSFET), a high-electron-mobility transistor (HEMT), a tunnel-FET (TFET), a planar transistor configuration, a dual-gate transistor configuration, a finned transistor configuration (e.g., fin-FET, tri-gate), and a nanowire (or nanoribbon or gate-all-around) transistor configuration. In addition, transistor 502 may be a p-type transistor device (e.g., p-MOS or p-TFET) and/or an n-type transistor device (e.g., n-MOS or n-TFET), depending on the particular configuration. For instance, in an example embodiment, transistor 502 is an n-MOS device. Further, the techniques may be used to integrate Schottky diodes as described herein with complementary transistor-based devices, such as complementary MOS (CMOS) or complementary TFET (CTFET) devices, or few to single electron quantum transistor devices, for example. Numerous variations and configurations for transistor or transistor-based devices to be used with and/or formed on the same substrate as Schottky diodes as described herein will be apparent in light of this disclosure.

Figure 6:
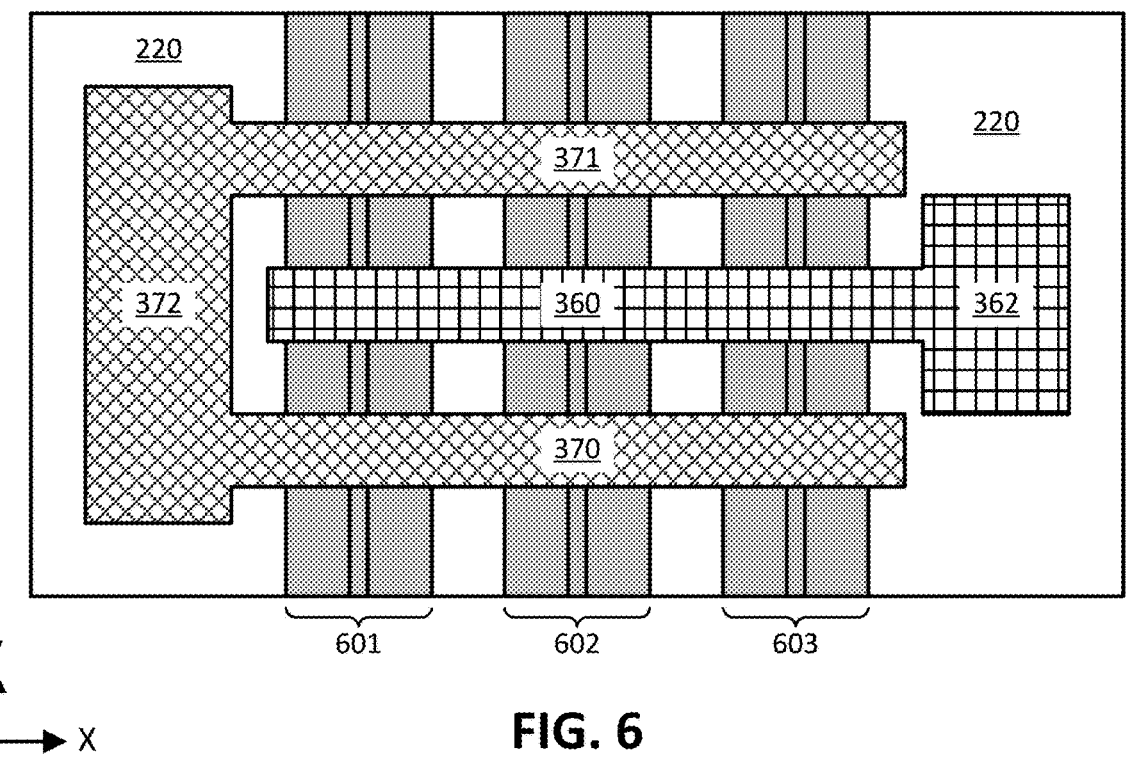
FIG. 6 illustrates a top view of an example IC structure including three Schottky diodes formed on semipolar planes of III-N structures, where the three Schottky diodes are electrically connected in parallel, in accordance with an embodiment of the present disclosure.

FIG. 6 illustrates a top view of an example IC structure including three Schottky diodes formed on semipolar planes of III-N structures, where the three Schottky diodes are electrically connected in parallel, in accordance with an embodiment of the present disclosure. Schottky diodes may be placed in parallel (or in series) to achieve desired electrical properties for a given circuit, for example, such as to address the amount of current the diode configuration can handle. In this example embodiment, the three Schottky diodes 601, 602, and 603 may have been formed using the techniques described herein, such as using method 100 of FIG. 1. Using method 100 for illustrative purposes, when performing process 120, the gate 360 and S/D contacts 370 and 371 may be formed over multiple Schottky diodes to connect them in parallel, such as is shown in FIG. 6. Here, three Schottky diodes 601, 602, and 603 are electrically connected in parallel; however, any number may be electrically connected (in either parallel or series) as desired (e.g., 2, 3, 4, 5, or more).

Figure 7:
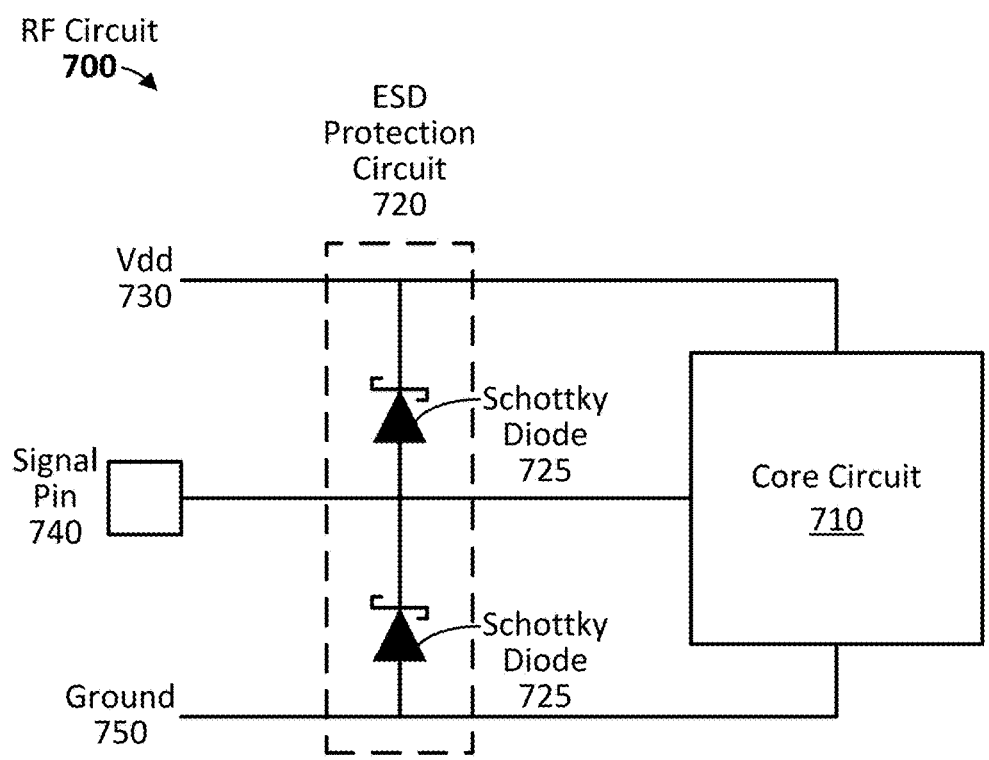
FIG. 7 illustrates an example radio frequency (RF) circuit including a core circuit portion and an electro-static discharge (ESD) protection circuit portion, in accordance with an embodiment of the present disclosure.

FIG. 7 illustrates an example radio frequency (RF) circuit 700 including a core circuit portion 710 and an electro-static discharge (ESD) protection circuit portion 720, in accordance with an embodiment of the present disclosure. In the context of RF applications, ESD protection circuits are important to help protect the core circuit from electro-static discharges. Such ESD protection circuits typically include two diodes electrically connected to the core circuit, which in the case of RF applications could include one or more power amplifier (PA) transistors, low-noise amplifier (LNA) transistors, and/or any other suitable devices. Thus, being able to form diodes in close proximity with the core circuit portion of an RF circuit is desirable for an ESD protection circuit plus core circuit design. FIG. 7 illustrates such a design, where core circuit 710 may include any suitable devices (e.g., one or more PA transistors, LNA transistors, and/or other suitable devices) and ESD protection circuit, which is electrically connected to the core circuit as shown to protect it from ESD occurrences, includes two Schottky diodes 725. The Schottky diodes 725, in this example embodiment, may be formed using the techniques and structures variously described herein. Recall that the Schottky diodes described herein can be formed in close proximity to III-N transistors, thereby making them desirable for such RF applications (e.g., ESD protection circuit applications). For purposes of complete description, RF circuit also includes supply voltage (Vdd) 730, signal pin 740, and ground 750 as indicated. Numerous variations, configurations, and applications will be apparent in light of this disclosure.

Example System

Figure 8:
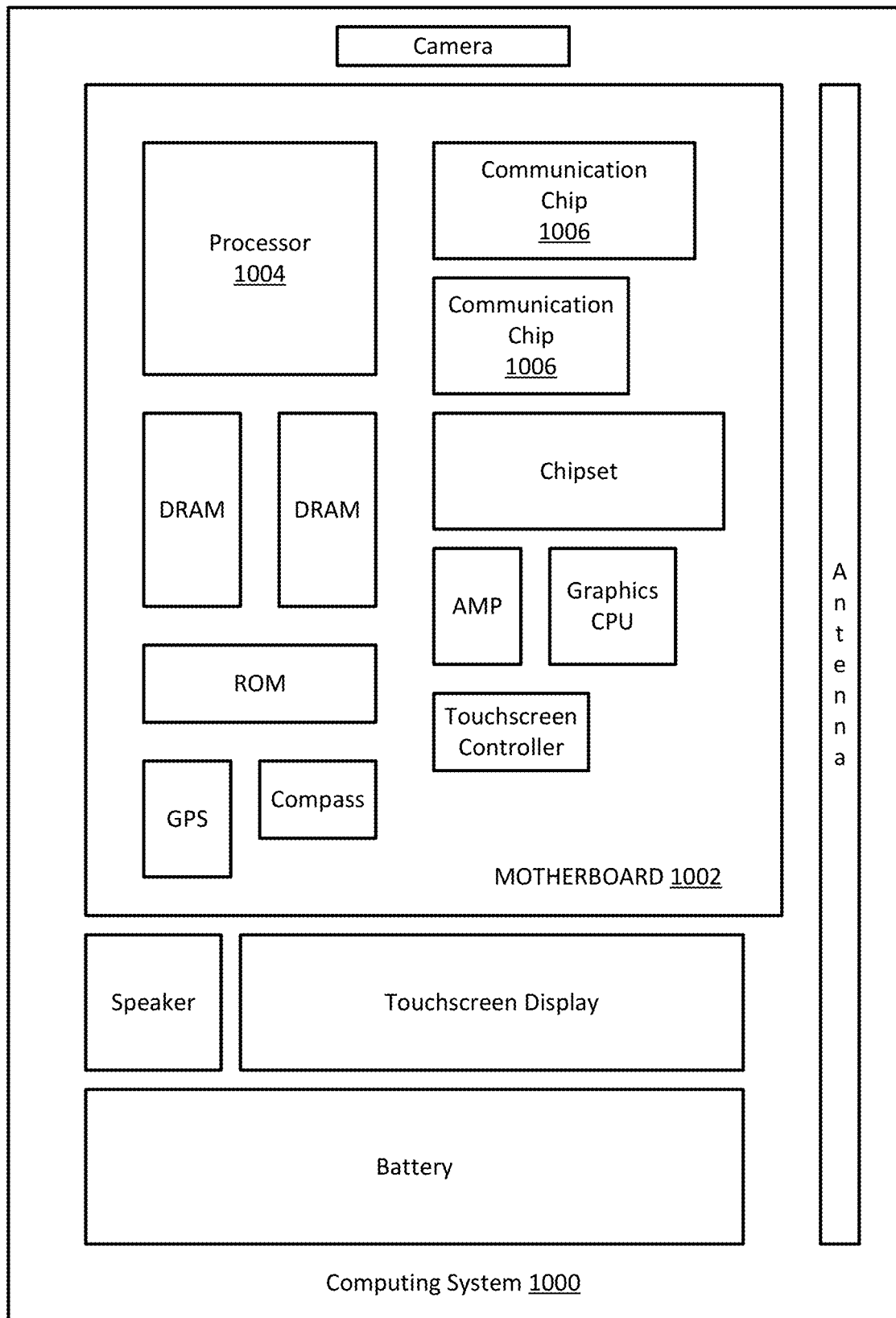
FIG. 8 illustrates an example computing system implemented with the IC structures and/or techniques disclosed herein, in accordance with some embodiments of the present disclosure.

FIG. 8 illustrates an example computing system 1000 implemented with the integrated circuit structures and/or techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more Schottky diodes as variously described herein, such as in ESD protection circuitry for a multitude of RF applications.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit (IC) including: a substrate; a first structure including group III-nitride (III-N) material having a first bandgap, the first structure at least one of on and above the substrate; a polarization charge inducing layer on a semipolar plane of the first structure, the polarization charge inducing layer having a second bandgap larger than the first bandgap; a gate on the polarization charge inducing layer, the gate including at least one metal; and source and drain (S/D) contacts adjacent two sides of the gate, wherein the S/D contacts are electrically connected to each other.

Example 2 includes the subject matter of Example 1, wherein the substrate includes silicon (Si).

Example 3 includes the subject matter of any of Examples 1-2, wherein the first structure includes gallium nitride (GaN).

Example 4 includes the subject matter of any of Examples 1-3, wherein the semipolar plane has a Miller-Bravais index of one of {11-22}, {10-11}, and {10-13}.

Example 5 includes the subject matter of any of Examples 1-4, wherein the semipolar plane has an angle of inclination in the range of 10 to 80 degrees or 100 to 170 degrees relative to a top plane of a shallow trench isolation layer Example 6 includes the subject matter of any of Examples 1-5, wherein the first structure includes two semipolar planes and wherein the polarization charge inducing layer and gate are each above the two semipolar planes.

Example 7 includes the subject matter of any of Examples 1-6, wherein the first structure has a triangular prism-like shape above a top plane of a shallow trench isolation (STI) layer.

Example 8 includes the subject matter of any of Examples 1-6, wherein the first structure has a trapezoidal prism-like shape above a top plane of a shallow trench isolation (STI) layer.

Example 9 includes the subject matter of any of Examples 1-8, wherein the polarization charge inducing layer is between the first structure and each of the S/D contacts.

Example 10 includes the subject matter of any of Examples 1-8, wherein the polarization charge inducing layer is not present between the first structure and each of the S/D contacts.

Example 11 includes the subject matter of any of Examples 1-10, wherein the polarization charge inducing layer includes group III-N material that includes aluminum (Al).

Example 12 includes the subject matter of any of Examples 1-11, wherein the polarization charge inducing layer has a multilayer configuration of at least two layers, each layer of the multilayer configuration including group III-N material.

Example 13 includes the subject matter of any of Examples 1-12, further including a second structure including group III-N material, the second structure at least one of on and above the substrate, wherein a transistor is formed at least one of on and in the second structure.

Example 14 is a Schottky diode including the subject matter of any of Examples 1-13.

Example 15 is an electro-static discharge (ESD) circuit including the subject matter of any of Examples 1-14.

Example 16 is a computing system including the subject matter of any of Examples 1-15.

Example 17 is an integrated circuit (IC) including: a substrate; a shallow trench isolation (STI) layer on the substrate; a first structure including group III-nitride (III-N) material having a first bandgap, the first structure above at least one opening in the STI layer; and a diode at least one of on and in a sidewall of the first structure, the diode including a gate including at least one metal, a polarization charge inducing layer between the gate and the plane of the first structure, the polarization charge inducing layer having a second bandgap larger than the first bandgap, and source and drain (S/D) contacts adjacent two sides of the gate, wherein the S/D contacts are electrically connected to each other.

Example 18 includes the subject matter of Example 17, wherein the substrate includes silicon (Si).

Example 19 includes the subject matter of any of Examples 17-18, wherein the first structure includes gallium nitride (GaN).

Example 20 includes the subject matter of any of Examples 17-19, wherein the sidewall is a semipolar plane of the first structure, the semipolar plane having a Miller-Bravais index of one of {11-22}, {10-11}, and {10-13}.

Example 21 includes the subject matter of any of Examples 17-20, wherein the sidewall is a semipolar plane of the first structure, the semipolar plane having an angle of inclination in the range of 10 to 80 or 100 to 170 degrees relative to a top plane of the STI layer Example 22 includes the subject matter of any of Examples 17-21, further including a nucleation layer between the first structure and the substrate.

Example 23 includes the subject matter of any of Examples 17-22, wherein the at least one opening in the STI layer has a width between the STI material in the range of 100 nanometer (nm) to 1 micron.

Example 24 includes the subject matter of any of Examples 17-23, wherein the first structure is at least one of above and in only one opening in the STI layer.

Example 25 includes the subject matter of any of Examples 17-24, wherein the first structure has a triangular prism-like shape above a top plane of the STI layer.

Example 26 includes the subject matter of any of Examples 17-23, wherein the first structure is at least one of above and in multiple adjacent openings in the STI layer.

Example 27 includes the subject matter of any of Examples 17-23 and 26, wherein the first structure has a trapezoidal prism-like shape above a top plane of the STI layer.

Example 28 includes the subject matter of any of Examples 17-27, wherein the polarization charge inducing layer is between the first structure and each of the S/D contacts.

Example 29 includes the subject matter of any of Examples 17-27, wherein the polarization charge inducing layer is not present between the first structure and each of the S/D contacts.

Example 30 includes the subject matter of any of Examples 17-29, wherein the polarization charge inducing layer includes group III-N material and includes aluminum (Al).

Example 31 includes the subject matter of any of Examples 17-30, wherein the polarization charge inducing layer has a multilayer configuration of at least two layers, each layer of the multilayer configuration including group III-N material.

Example 32 includes the subject matter of any of Examples 17-31, further including a second structure including group III-N material, the second structure at least one of on and above the substrate, wherein a transistor is formed at least one of on and in the second structure.

Example 33 includes the subject matter of any of Examples 17-32, wherein the diode is a Schottky diode.

Example 34 is an electro-static discharge (ESD) circuit including the subject matter of any of Examples 17-33.

Example 35 is a computing system including the subject matter of any of Examples 17-34.

Example 36 is a method of forming an integrated circuit (IC), the method including: forming a shallow trench isolation (STI) layer on a substrate; forming at least one opening in the STI layer; growing group III-nitride (III-N) material on the substrate and from the at least one opening in the STI layer to form a first structure including group III-N material having a first bandgap; forming a polarization charge inducing layer on a semipolar plane of the first structure, the polarization charge inducing layer having a second bandgap larger than the first bandgap; forming a gate on the polarization charge inducing layer; and forming source and drain (S/D) contacts adjacent two sides of the gate, wherein the S/D contacts are electrically connected to each other.

Example 37 includes the subject matter of Example 36, wherein the substrate includes silicon (Si).

Example 38 includes the subject matter of any of Examples 36-37, wherein the at least one opening in the STI layer is only one opening.

Example 39 includes the subject matter of any of Examples 36-38, wherein the at least one opening in the STI layer is multiple adjacent openings.

Example 40 includes the subject matter of any of Examples 36-39, wherein growing group III-N material on the substrate is performed using a lateral epitaxial overgrowth (LEO) process.

Example 41 includes the subject matter of any of Examples 36-40, wherein growing group III-N material on the substrate includes first growing a nucleation layer including III-N material and then growing group III-N material to form the first structure.

Example 42 includes the subject matter of any of Examples 36-41, wherein the first structure includes gallium nitride (GaN).

Example 43 includes the subject matter of any of Examples 36-42, wherein the semipolar plane is on a sidewall of the first structure.

Example 44 includes the subject matter of any of Examples 36-43, wherein the polarization charge inducing layer has a multilayer structure including at least two material layers.

Example 45 includes the subject matter of any of Examples 36-44, wherein the polarization charge inducing layer includes group III-N material that includes aluminum (Al).

Example 46 includes the subject matter of any of Examples 36-45, wherein the gate is a Schottky gate.

Example 47 includes the subject matter of any of Examples 36-46, further including, prior to forming S/D contacts at S/D locations, removing the polarization charge inducing layer from the S/D locations and forming n-type doped III-N material at those S/D locations.

Example 48 includes the subject matter of any of Examples 36-47, further including forming a second structure from at least one other opening in the STI layer, the second structure including group III-N material, wherein a transistor is formed on the second structure.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
a shallow trench isolation structure;
a first structure including a bottom portion and a top portion, wherein sidewalls of the bottom portion of the first structure are laterally adjacent to the shallow trench isolation structure, and the top portion of the first structure includes a semipolar plane that extends above the surface of the shallow trench isolation structure, the first structure including a first group III-nitride (III-N) material having a first bandgap;
- a second structure on at least a first portion of the semipolar plane of the first structure, the second structure including a second group III-nitride (III-N) material having a second bandgap larger than the first bandgap;
- a gate structure over at least a portion of the second structure, the gate structure including at least one metal;
- a source region to one side of the gate structure and a drain region to an opposite side of the gate structure; and
- a first contact structure on the source region, and a second contact structure on the drain region, wherein the first and second contact structure are electrically connected to each other.

2. The integrated circuit of claim 1, further comprising a substrate, wherein the shallow trench isolation structure is above the substrate, and the first structure extends up from the substrate and through the shallow trench isolation structure, the substrate including silicon.

3. The integrated circuit of claim 1, wherein the first structure consists essentially of gallium and nitrogen, and the second structure includes aluminum.

4. The integrated circuit of claim 1, wherein the semipolar plane has a Miller-Bravais index of one of {11-22}, {10-11}, or {10-13}.

5. The integrated circuit of claim 1, wherein the semipolar plane has an angle of inclination in the range of 10 to 80 degrees or 100 to 170 degrees relative to the surface of the shallow trench isolation structure.

6. The integrated circuit of claim 1, wherein the first structure includes two semipolar planes and wherein the second structure and gate are each above the two semipolar planes.

7. The integrated circuit of claim 1, wherein the top portion of the first structure has a triangular or trapezoidal cross-sectional shape.

8. The integrated circuit of claim 1, wherein the second structure is between the first structure and each of the first and second contact structures.

9. The integrated circuit of claim 1, wherein the second structure is not present between the first structure and each of the first and second contact structures.

10. The integrated circuit of claim 1, wherein the second structure has a multilayer configuration of at least two layers.

11. The integrated circuit of claim 1, further comprising a transistor at least one of on and in a third structure, the third structure including a group III-N material.

12. The integrated circuit of claim 1, wherein the gate structure, source region, drain region, first contact structure, and second contact structure are part of a Schottky diode.

13. An electro-static discharge (ESD) circuit comprising the integrated circuit of claim 1.

14. A computing system comprising the integrated circuit of claim 1.

15. An integrated circuit, comprising:
- a shallow trench isolation structure;
- a first structure including a bottom portion and a top portion, wherein sidewalls of the bottom portion of the first structure are laterally adjacent to the shallow trench isolation structure, and the top portion of the first structure includes a semipolar plane that extends above the surface of the shallow trench isolation structure, the first structure consisting essentially of gallium and nitrogen (GaN);
- a second structure on a first portion of the semipolar plane of the first structure, the second structure including a group III-nitride (III-N) material which includes aluminum, the second structure including one or more layers;
- a gate structure over at least a portion of the second structure, the gate structure including at least one metal;
- a source region to one side of the gate structure and a drain region to an opposite side of the gate structure; and
- a first contact structure on the source region, and a second contact structure on the drain region, wherein the first and second contact structure are electrically connected to each other, and wherein the second structure is not present between the first structure and each of the first and second contact structures.

16. The integrated circuit of claim 15, wherein the semipolar plane has an angle of inclination in the range of 10 to 80 degrees or 100 to 170 degrees relative to the surface of the shallow trench isolation structure.

17. The integrated circuit of claim 15, wherein the top portion of the first structure has a triangular or trapezoidal cross-sectional shape.

18. An integrated circuit, comprising:
- a shallow trench isolation structure;
- a first structure including a bottom portion and a top portion, wherein sidewalls of the bottom portion of the first structure are laterally adjacent to the shallow trench isolation structure, and the top portion of the first structure includes a semipolar plane that extends above the surface of the shallow trench isolation structure, the first structure consisting essentially of gallium and nitrogen (GaN);
- a second structure on the semipolar plane of the first structure, the second structure including a group III-nitride (III-N) material which includes aluminum, the second structure including one or more layers;
- a gate structure over at least a portion of the second structure, the gate structure including at least one metal;
- a source region to one side of the gate structure and a drain region to an opposite side of the gate structure; and
- a first contact structure on the source region, and a second contact structure on the drain region, wherein the first and second contact structure are electrically connected to each other, and wherein the second structure is between the first structure and each of the first and second contact structures.

19. The integrated circuit of claim 18, wherein the semipolar plane has an angle of inclination in the range of 10 to 80 degrees or 100 to 170 degrees relative to the surface of the shallow trench isolation structure.

20. The integrated circuit of claim 18, wherein the top portion of the first structure has a triangular or trapezoidal cross-sectional shape.

* * * * *